(12) United States Patent
Zhou et al.

(10) Patent No.: US 11,362,100 B2
(45) Date of Patent: Jun. 14, 2022

(54) FINFET SPLIT GATE NON-VOLATILE MEMORY CELLS WITH ENHANCED FLOATING GATE TO FLOATING GATE CAPACITIVE COUPLING

(71) Applicant: Silicon Storage Technology, Inc., San Jose, CA (US)

(72) Inventors: Feng Zhou, Fremont, CA (US); Xian Liu, Sunnyvale, CA (US); Steven Lemke, Boulder Creek, CA (US); Hieu Van Tran, San Jose, CA (US); Nhan Do, Saratoga, CA (US)

(73) Assignee: Silicon Storage Technology, Inc., San Jose, CA (US)

(*) Notice: Subject to any disclaimer, the term of this patent is extended or adjusted under 35 U.S.C. 154(b) by 92 days.

(21) Appl. No.: 17/069,563

(22) Filed: Oct. 13, 2020

(65) Prior Publication Data

US 2021/0305264 A1 Sep. 30, 2021

Related U.S. Application Data

(60) Provisional application No. 62/994,187, filed on Mar. 24, 2020.

(51) Int. Cl.
*H01L 27/11517* (2017.01)
*H01L 27/11529* (2017.01)
(Continued)

(52) U.S. Cl.
CPC .. *H01L 27/11529* (2013.01); *H01L 27/11551* (2013.01); *H01L 29/42328* (2013.01); *H01L 29/66825* (2013.01)

(58) Field of Classification Search
CPC ......... H01L 27/11521; H01L 27/11529; H01L 27/11551; H01L 29/42328; H01L 29/66795; H01L 29/66825
See application file for complete search history.

(56) References Cited

U.S. PATENT DOCUMENTS

| 5,029,130 A | 7/1991 | Yeh |
| 6,747,310 B2 | 6/2004 | Fan et al. |
| | (Continued) | |

FOREIGN PATENT DOCUMENTS

| EP | 1 801 857 A2 | 7/2007 |
| EP | 1 93 9 942 A2 | 7/2008 |
| | (Continued) | |

OTHER PUBLICATIONS

Written Opinion in PCT/US2020/055606 (Year: 2020).*
(Continued)

*Primary Examiner* — Mary A Wilczewski
(74) *Attorney, Agent, or Firm* — DLA Piper LLP (US)

(57) ABSTRACT

Memory cells formed on upwardly extending fins of a semiconductor substrate, each including source and drain regions with a channel region therebetween, a floating gate extending along the channel region and wrapping around the fin, a word line gate extending along the channel region and wrapping around the fin, a control gate over the floating gate, and an erase gate over the source region. The control gates are a continuous conductive strip of material. First and second fins are spaced apart by a first distance. Third and fourth fins are spaced apart by a second distance. The second and third fins are spaced apart by a third distance greater than the first and second distances. The continuous strip includes a portion disposed between the second and third fins, but no portion of the continuous strip is disposed between the first and second fins nor between the third and fourth fins.

18 Claims, 25 Drawing Sheets

(51) Int. Cl.
*H01L 29/788* (2006.01)
*H01L 29/423* (2006.01)
*H01L 29/66* (2006.01)
*H01L 27/11551* (2017.01)

(56) References Cited

U.S. PATENT DOCUMENTS

| | | | |
|---|---|---|---|
| 7,315,056 B2 | 1/2008 | Klinger | |
| 7,329,580 B2* | 2/2008 | Choi | H01L 21/84 |
| | | | 438/257 |
| 7,410,913 B2 | 8/2008 | Lee | |
| 7,423,310 B2 | 9/2008 | Verhoeven | |
| 7,847,338 B2* | 12/2010 | Widjaja | H01L 27/10897 |
| | | | 257/315 |
| 7,868,375 B2 | 1/2011 | Liu | |
| 7,927,994 B1 | 4/2011 | Liu | |
| 8,068,370 B2 | 11/2011 | Lue | |
| 8,148,768 B2 | 4/2012 | Do et al. | |
| 8,420,476 B2 | 4/2013 | Booth, Jr. | |
| 8,461,640 B2 | 6/2013 | Hu | |
| 8,710,485 B2 | 4/2014 | Saitoh et al. | |
| 8,941,153 B2 | 1/2015 | Lee et al. | |
| 9,276,005 B1 | 3/2016 | Zhou | |
| 9,276,006 B1 | 3/2016 | Chen | |
| 9,406,689 B2 | 8/2016 | Li | |
| 9,614,048 B2 | 4/2017 | Wu | |
| 9,634,018 B2 | 4/2017 | Su | |
| 9,972,630 B2 | 5/2018 | Su | |
| 9,985,042 B2 | 5/2018 | Su | |
| 10,217,850 B2 | 2/2019 | Zhou et al. | |
| 10,249,631 B2 | 4/2019 | Su et al. | |
| 10,312,247 B1* | 6/2019 | Jourba | H01L 29/42328 |
| 10,468,428 B1 | 11/2019 | Zhou et al. | |
| 10,644,012 B2 | 5/2020 | Jourba et al. | |
| 10,727,240 B2 | 7/2020 | Jourba et al. | |
| 10,797,142 B2 | 10/2020 | Jourba et al. | |
| 10,937,794 B2* | 3/2021 | Zhou | H01L 29/66537 |
| 11,114,451 B1* | 9/2021 | Zhou | H01L 29/66545 |
| 2005/0012137 A1 | 1/2005 | Levi | |
| 2005/0023591 A1* | 2/2005 | Ding | H01L 27/11526 |
| | | | 438/257 |
| 2005/0227435 A1 | 10/2005 | Oh | |
| 2005/0266638 A1 | 12/2005 | Cho et al. | |
| 2005/0280000 A1 | 12/2005 | Ishii | |
| 2006/0097310 A1 | 5/2006 | Kim | |
| 2006/0208307 A1 | 9/2006 | Chang | |
| 2006/0249779 A1 | 11/2006 | Choi | |
| 2006/0278915 A1* | 12/2006 | Lee | H01L 29/66825 |
| | | | 257/E29.302 |
| 2007/0090443 A1* | 4/2007 | Choi | H01L 27/115 |
| | | | 438/257 |
| 2007/0158730 A1 | 7/2007 | Burnett | |
| 2008/0173921 A1 | 7/2008 | Li | |
| 2009/0090955 A1 | 4/2009 | Wang et al. | |
| 2010/0320525 A1 | 12/2010 | Nagashima | |
| 2013/0270627 A1 | 10/2013 | Cheng | |
| 2015/0035039 A1* | 2/2015 | Li | H01L 21/845 |
| | | | 438/257 |
| 2016/0020219 A1 | 1/2016 | Chuang | |
| 2016/0064398 A1 | 3/2016 | Toh | |
| 2016/0218110 A1 | 7/2016 | Yang et al. | |
| 2016/0307911 A1* | 10/2016 | Wu | H01L 27/11548 |
| 2016/0379987 A1 | 12/2016 | Liu | |
| 2017/0117285 A1 | 4/2017 | Chen | |
| 2017/0125429 A1* | 5/2017 | Su | H01L 29/42328 |
| 2017/0243955 A1 | 8/2017 | Shinohara | |
| 2017/0271484 A1 | 9/2017 | Baars et al. | |
| 2017/0301683 A1 | 10/2017 | Chen | |
| 2017/0345840 A1* | 11/2017 | Su | H01L 29/42328 |
| 2018/0226420 A1* | 8/2018 | Su | H01L 29/42328 |
| 2018/0315765 A1 | 11/2018 | Lin | |
| 2020/0176459 A1 | 6/2020 | Zhou et al. | |
| 2020/0176578 A1* | 6/2020 | Jourba | H01L 27/11524 |
| 2021/0193671 A1* | 6/2021 | Jourba | H01L 29/66825 |
| 2021/0305264 A1* | 9/2021 | Zhou | H01L 29/66825 |

FOREIGN PATENT DOCUMENTS

| | | | | |
|---|---|---|---|---|
| KR | 2008 0061764 | | 7/2008 | |
| TW | 201539454 A | | 10/2015 | |
| WO | WO 2021/194552 | * | 9/2021 | H01L 21/11521 |

OTHER PUBLICATIONS

Eun Suk Cho, et al., "Hf-silicate Inter-poly Dielectric Technology for Sub 70 nm Body Tied FinFET Flash Memory," VLSI Technology, Digest of Technical Papers, 2005 Symposium on Kyoto, Japan, Jun. 14-16, 2005, Piscataway, NJ, USA, IEEE, Piscataway, NJ, USA, Jun. 14, 2005, pp. 208-209, XPO10818301.

U.S. Appl. No. 16/724,010, filed Dec. 20, 2019 entitled "Method of Forming a Device with Split Gate Non-volatile Memory Cells, HV Devices Having Planar Channel Regions and FINFET Logic Devices," Jourba et al.

U.S. Appl. No. 16/803,876, filed Feb. 27, 2020, entitled "Method of Forming a Device with FINFET Split Gate Non-volatile Memory Cells and FINFET Logic Devices," Zhou, et al.

* cited by examiner

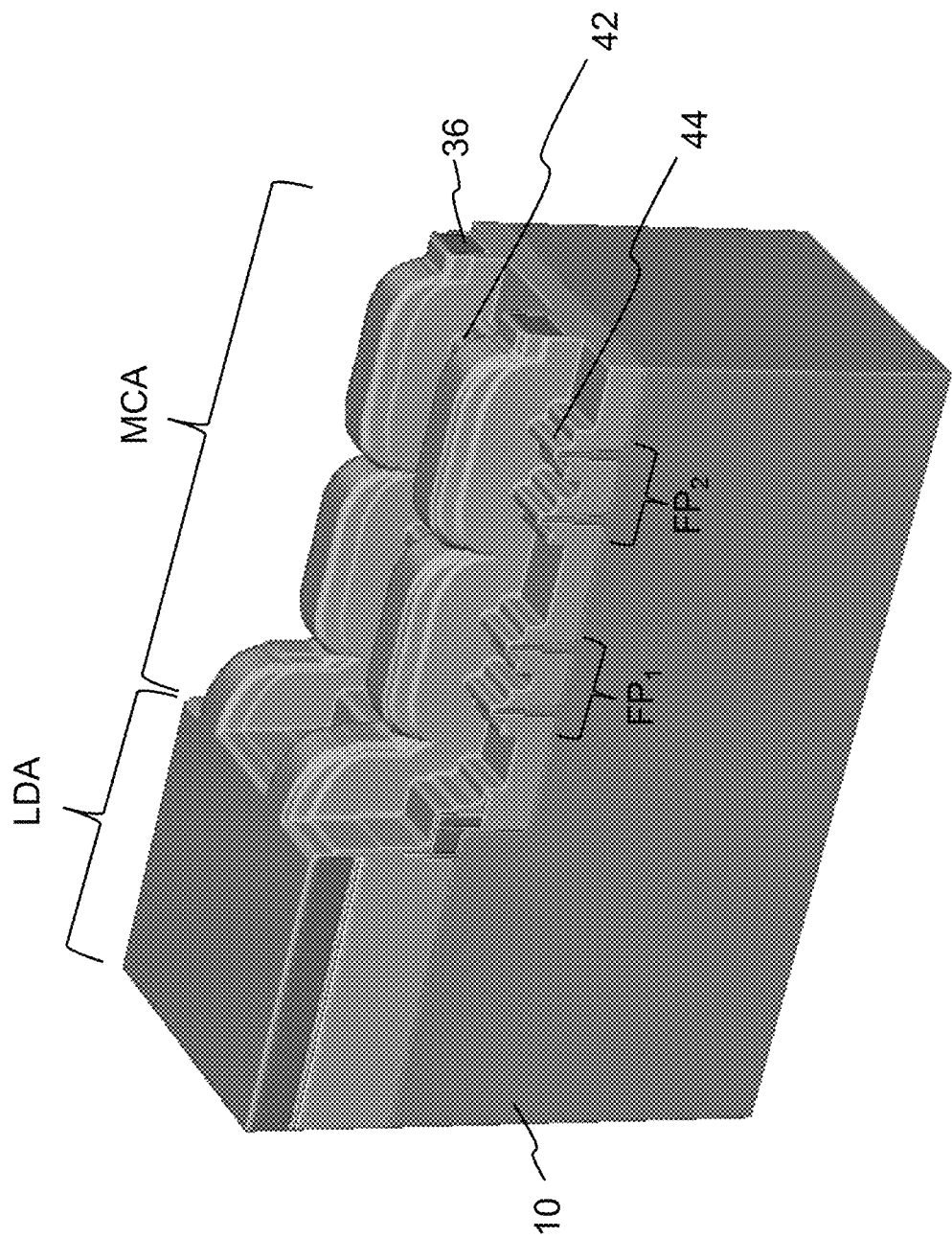

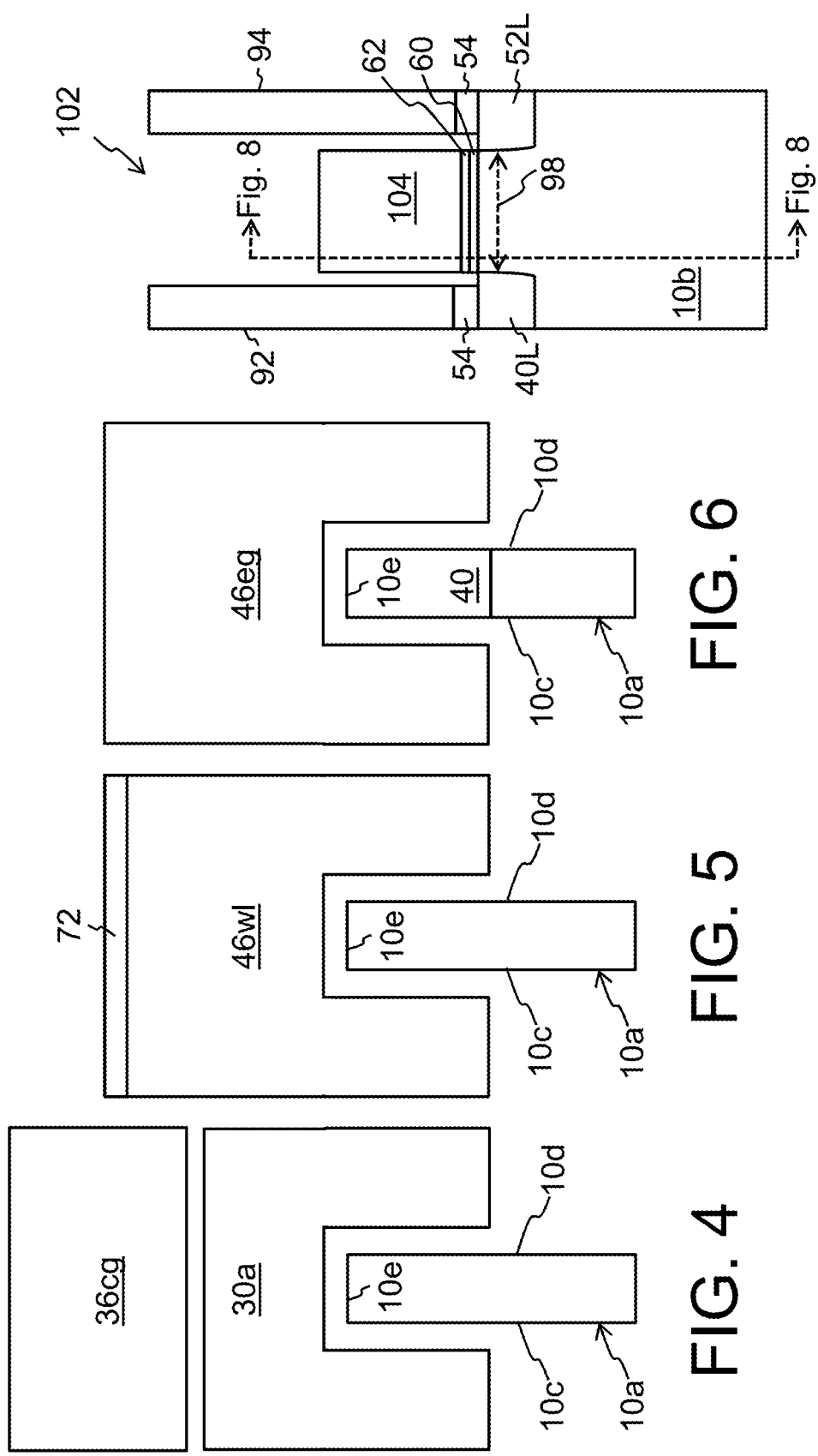

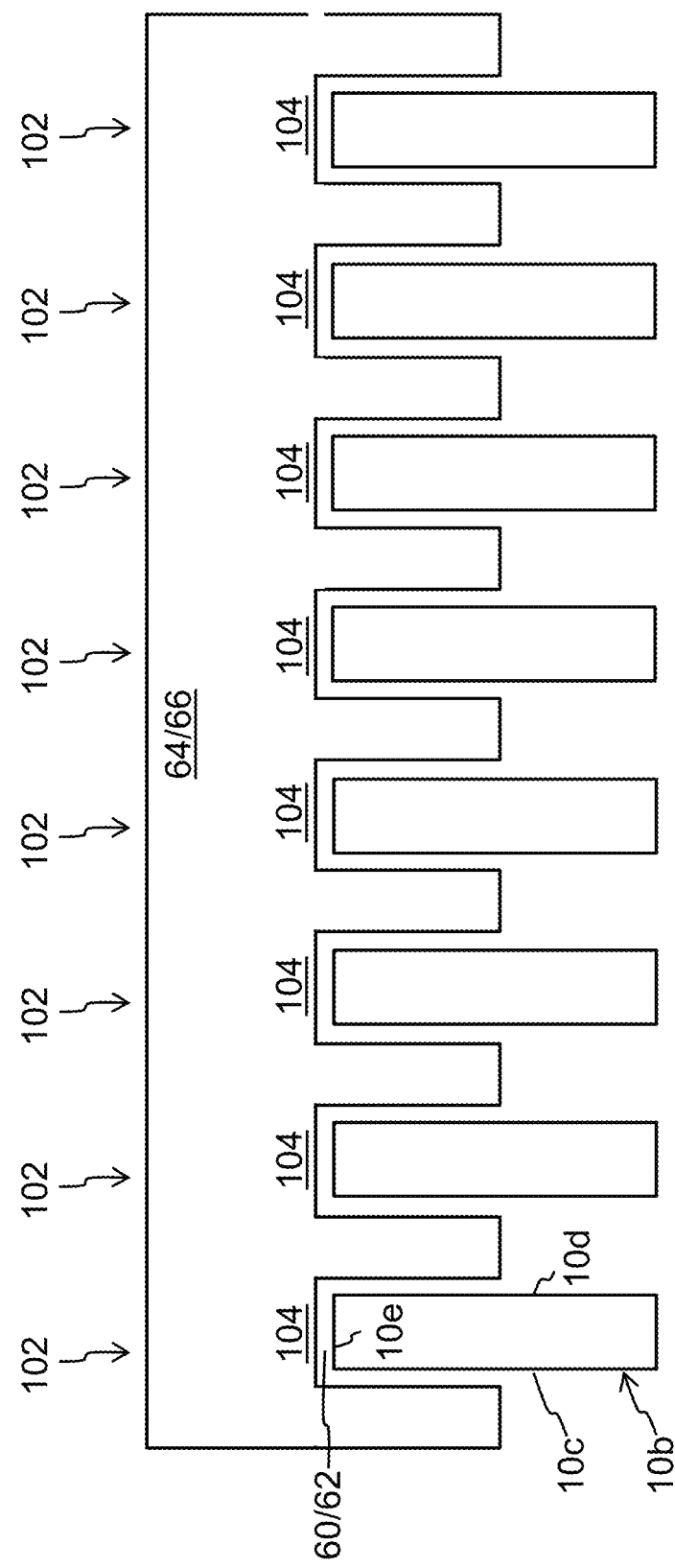

FINFET SPLIT GATE NON-VOLATILE MEMORY CELLS WITH ENHANCED FLOATING GATE TO FLOATING GATE CAPACITIVE COUPLING

RELATED APPLICATIONS

This application claims the benefit of U.S. Provisional Application No. 62/994,187, filed Mar. 24, 2020, and which is incorporated herein by reference.

FIELD OF THE INVENTION

The present invention relates to non-volatile flash memory cells, and more particularly to split-gate memory cells formed as FinFET devices.

BACKGROUND OF THE INVENTION

Split gate non-volatile flash memory cells having a floating gate, a select gate, a control gate and an erase gate are well known in the art. See for example U.S. Pat. Nos. 6,747,310 and 7,868,375, which are incorporated herein by reference. It is also known to form such split gate memory cells with a FinFET structure, where the gates wrap around a fin shaped member of semiconductor material of the substrate. See for example U.S. Pat. No. 10,468,428, which is incorporated herein by reference.

FIG. 1A shows a cross section of two such memory cells 1 formed on the fin portion 2a of a semiconductor substrate 2 (e.g., silicon). Source and drain regions 3, 4 are formed in the fin 2a, defining a channel region 5 of the fin therebetween. A floating gate 6 is disposed over and insulated from a first portion of the channel region 5, a select gate 7 is disposed over and insulated from a second portion of the channel region 5, a control gate 8 is disposed over and insulated from the floating gate 6, and an erase gate 9 is disposed over and insulated from the source region 3 and includes a notch that wraps around an edge of the floating gate 6. The memory cells 1 are formed end to end along the fin 2a, where pairs of adjacent memory cells can share a common source region 3, and adjacent memory cell pairs can share a common drain region 4. The gates wrap around the fin 2a, so that the channel region 5 includes the top and opposing side surfaces of the fin 2a. For example, FIG. 1B is a cross section view along line a-a of FIG. 1A, showing a portion of three memory cells formed on three adjacent fins 2a. Floating gates 6 wrap around respective fin 2a, and control gates 8 wrap around respective floating gates 6. The control gates 8 are formed as a continuous control gate line extending across multiple fins 2a.

To erase a memory cell 1 (i.e., remove electrons from its floating gate 6), a high positive voltage is applied to the erase gate 9, which causes electrons on the floating gate 6 to tunnel through the insulation from the floating gate 6 to the erase gate 9. To program a memory cell 1 (i.e., inject electrons onto its floating gate 6), positive voltages are placed in the select gate 7, control gate 8 and source region 3, whereby electrons flowing through the channel region 5 from the drain region 4 to the source region 3 become accelerated and are injected through the insulation from the channel region 5 to the floating gate 6 (i.e., hot-electron injection). To read a memory cell, positive voltages are applied to the select gate 7, control gate 8 and drain region 4. If the floating gate 6 is erased (no negative charge), electrons will flow through the channel region 5, which is sensed as an erased state. If the floating gate 6 is programmed with electrons, the negative charge on the floating gate 6 will reduce or prevent electron flow through the channel region 5, which is sensed as a programmed state.

Capacitive coupling between adjacent floating gates 6 on different fins 2a could adversely affect memory cell operation. In conventional devices, undesirable capacitive coupling between floating gates 6 on adjacent fins is avoided in two ways. First, the fins 2a are spaced sufficiently far apart so that there is sufficient space between adjacent floating gates 6 to suppress capacitive coupling. Second, the control gate 8 extends down and in-between adjacent floating gates 6, to further suppress any possible floating gate to floating gate capacitive coupling, as shown in FIG. 1B.

BRIEF SUMMARY OF THE INVENTION

A memory device comprising a semiconductor substrate having an upper surface with a plurality of fins that extend upwardly, wherein each of the fins includes opposing side surfaces that terminate in a top surface, and wherein each of the plurality of fins includes a memory cell formed thereon that includes spaced apart source and drain regions in the fin, with a channel region of the fin extending along the opposing side surfaces and top surface of the fin between the source and drain regions, a floating gate that extends along a first portion of the channel region, wherein the floating gate wraps around the fin such that the floating gate extends along and is insulated from the opposing side surfaces and the top surface of the fin, a word line gate that extends along a second portion of the channel region, wherein the word line gate wraps around the fin such that the word line gate extends along and is insulated from the opposing side surfaces and the top surface of the fin, a control gate that is disposed over and insulated from the floating gate, and an erase gate that is disposed over and insulated from the source region. The control gates are a first continuous strip of conductive material. First, second, third and fourth fins of the plurality of fins each have lengths that are parallel to a first direction. The first and second fins are adjacent to each other, and spaced apart by a first distance. The third and fourth fins are adjacent to each other, and spaced apart by a second distance. The second and third fins are adjacent to each other, and spaced apart by a third distance. The first continuous strip of conductive material includes a portion that is disposed between the second and third fins, but no portion of the first continuous strip of conductive material is disposed between the first and second fins, and no portion of the first continuous strip of conductive material is disposed between the third and fourth fins.

A method of forming a memory device that includes forming a plurality of fins that extend upwardly from an upper surface of a semiconductor substrate, wherein each of the fins includes opposing side surfaces that terminate in a top surface, and forming a memory cell on each one of the plurality of fins, wherein the forming of each of the memory cells on one of the fins includes forming spaced apart source and drain regions in the fin, with a channel region of the fin extending along the opposing side surfaces and top surface of the fin between the source and drain regions, forming a floating gate that extends along a first portion of the channel region, wherein the floating gate wraps around the fin such that the floating gate extends along and is insulated from the opposing side surfaces and the top surface of the fin, forming a word line gate that extends along a second portion of the channel region, wherein the word line gate wraps around the fin such that the word line gate extends along and is insulated from the opposing side surfaces and the top surface of the fin, forming a control gate that is disposed over and insulated from the floating gate, and forming an erase gate that is disposed over and insulated from the source region. The control gates are a first continuous strip of conductive material. First, second, third and fourth fins of the plurality of fins each have lengths that are parallel to a first direction. The first and second fins are adjacent to each other, and spaced apart by a first distance. The third and fourth fins are adjacent to each other, and spaced apart by a second distance. The second and third fins are adjacent to each other, and spaced apart by a third distance. The first continuous strip of conductive material includes a portion that is disposed between the second and third fins, but no portion of the first continuous strip of conductive material is disposed between the first and second fins, and no portion of the first continuous strip of conductive material is disposed between the third and fourth fins.

Other objects and features of the present invention will become apparent by a review of the specification, claims and appended figures.

BRIEF DESCRIPTION OF THE DRAWINGS

FIG. 4 is a side cross sectional view of a memory cell in the memory cell area of the semiconductor substrate taken along the line FIG. 4-FIG. 4 in FIG. 3.

FIG. 5 is a side cross sectional view of a memory cell in the memory cell area of the semiconductor substrate taken along the line FIG. 5-FIG. 5 in FIG. 3.

FIG. 6 is a side cross sectional view of a memory cell in the memory cell area of the semiconductor substrate taken along the line FIG. 6-FIG. 6 in FIG. 3.

FIGS. 7-8 are side cross sectional views of a logic device in the logic device area of the semiconductor substrate.

DETAILED DESCRIPTION OF THE INVENTION

Contrary to prior art attempts to minimize floating gate to floating gate capacitive coupling, the present invention configures the memory cell array to actually enhance such capacitive coupling between some, but not all, adjacent floating gates, which can be used as a fine tuning mechanism when programming the memory cells.

Figure 1A:
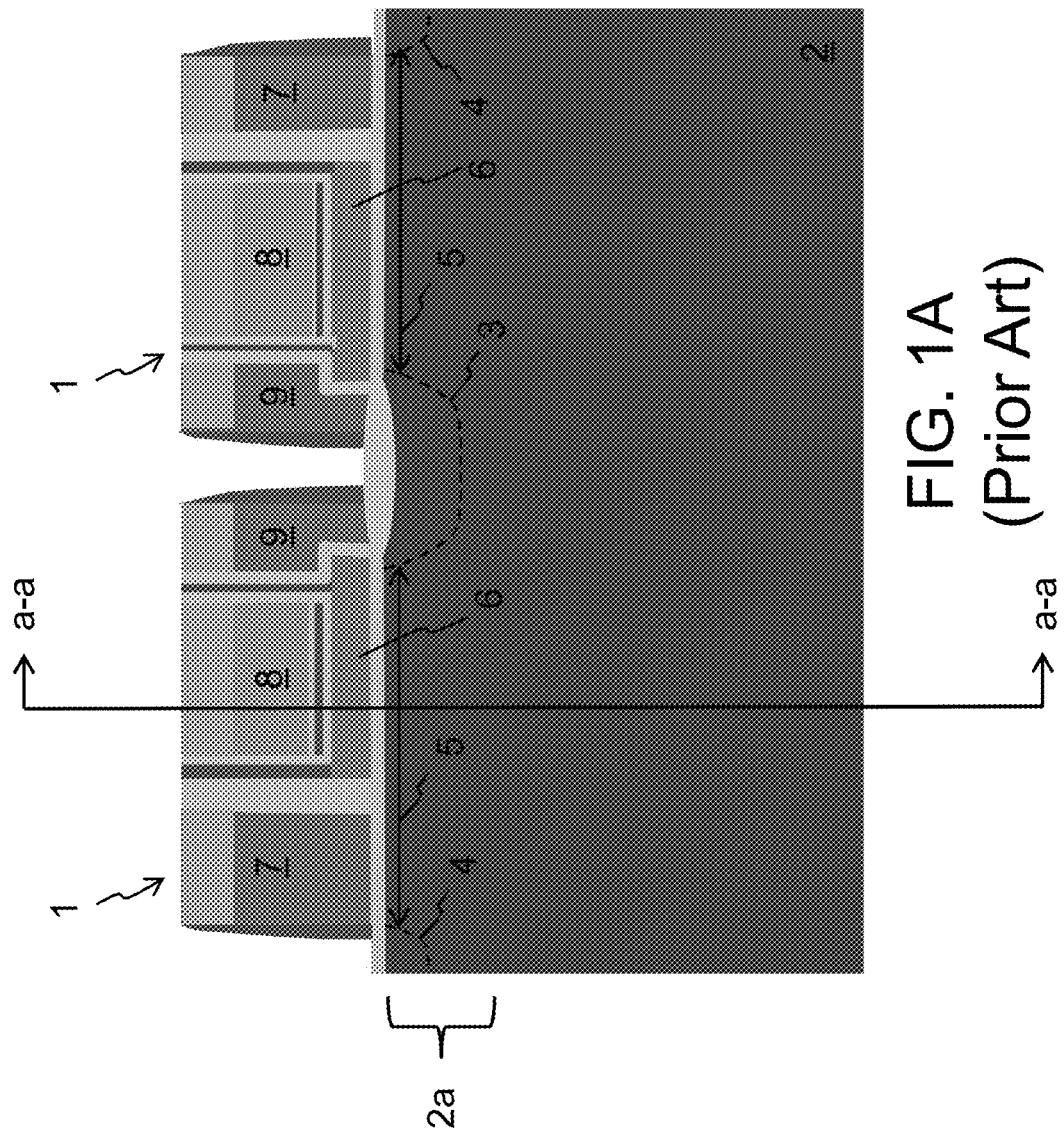
FIGS. 1A and 1B are side cross sectional views of conventional FinFET memory cells.
Figure 1B:
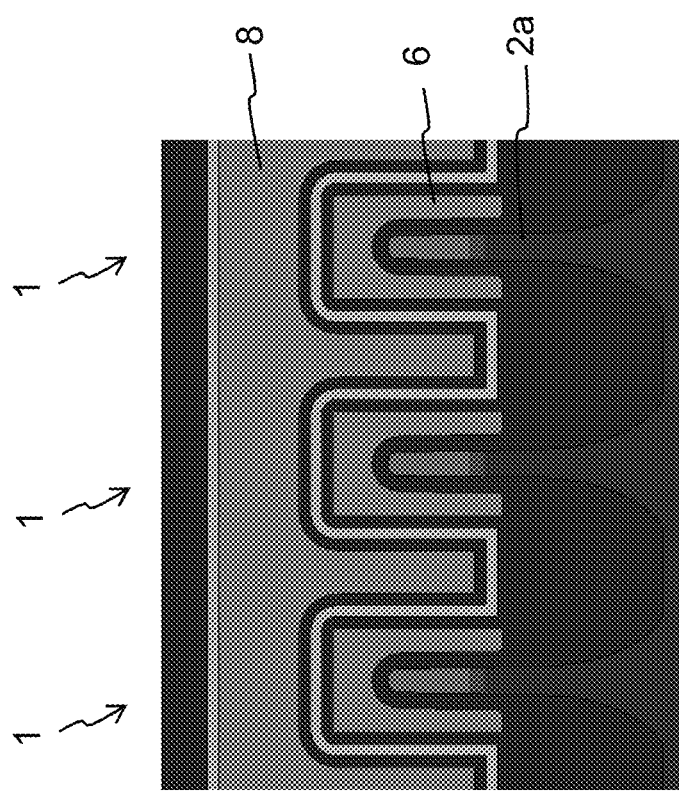
Figure 2A:
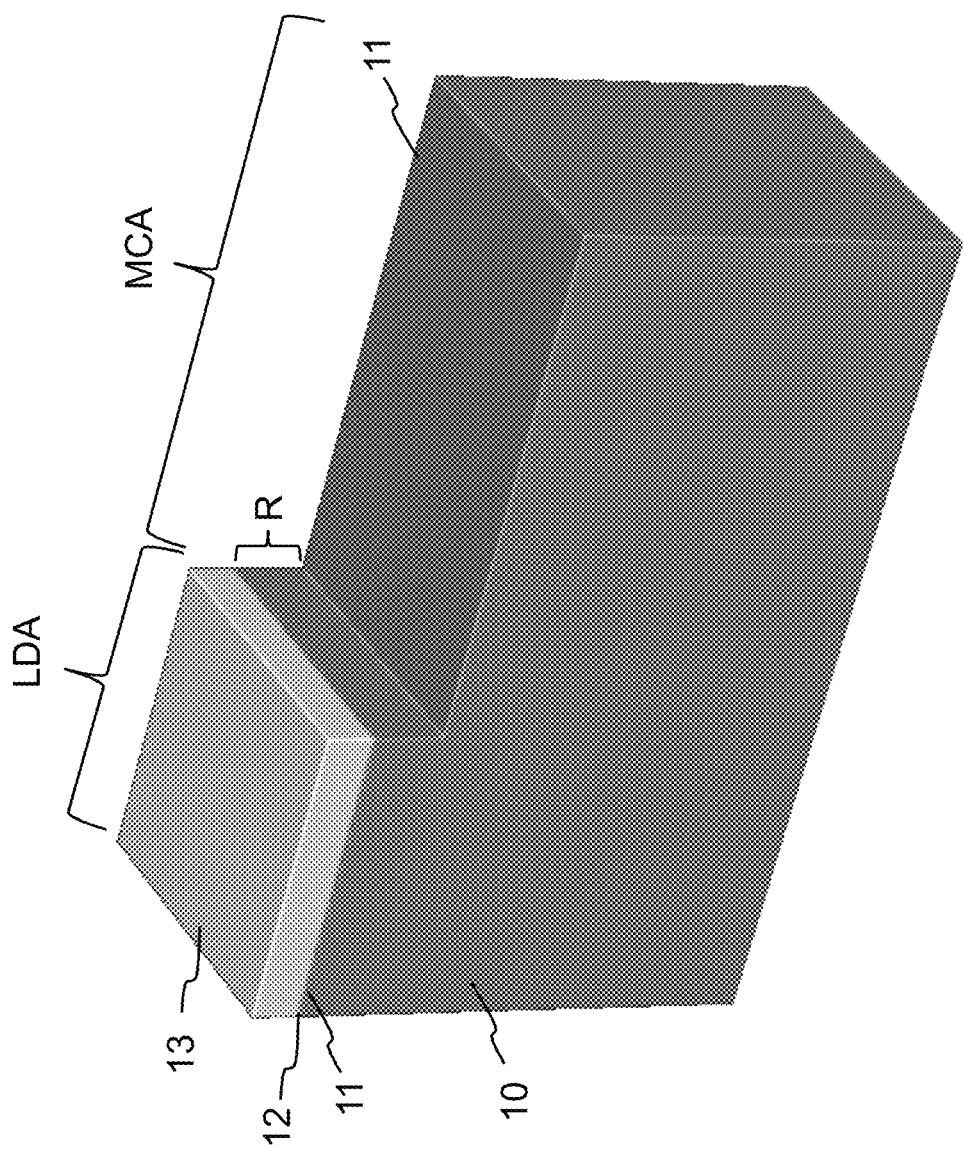
FIGS. 2A-2O are perspective views showing the steps in forming the memory cells of the present invention.
Figure 2B:
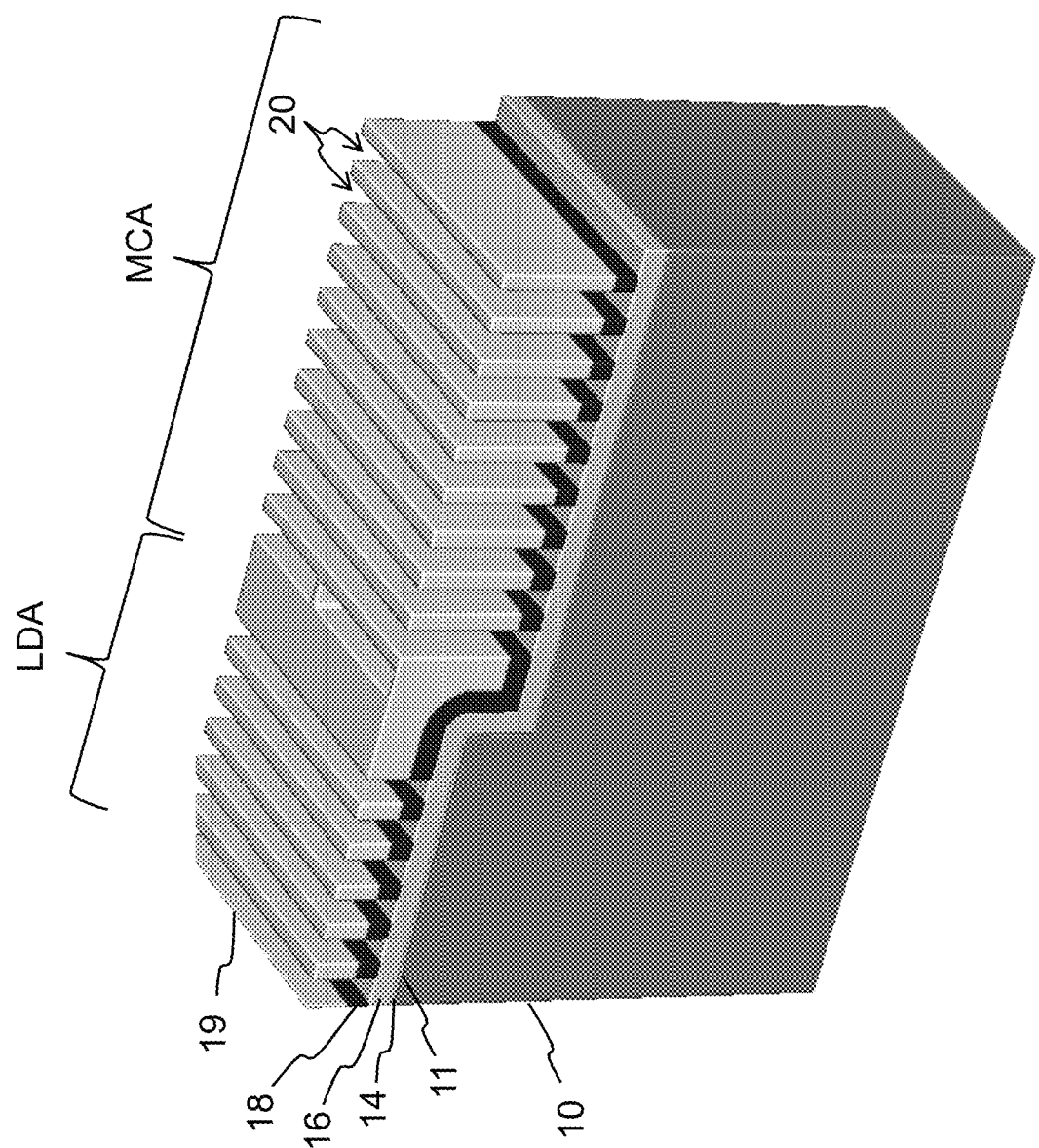
Figure 2C:
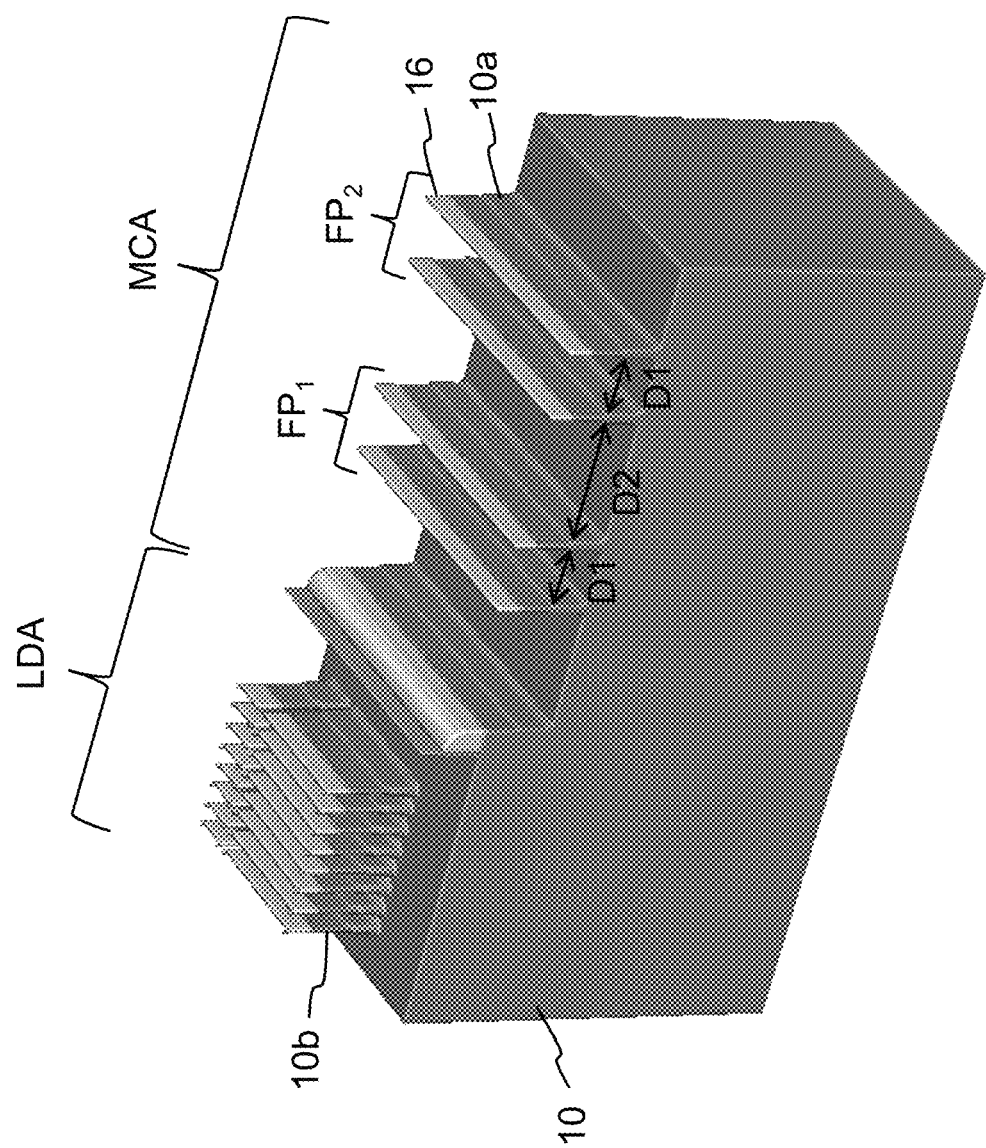
Figure 2D:
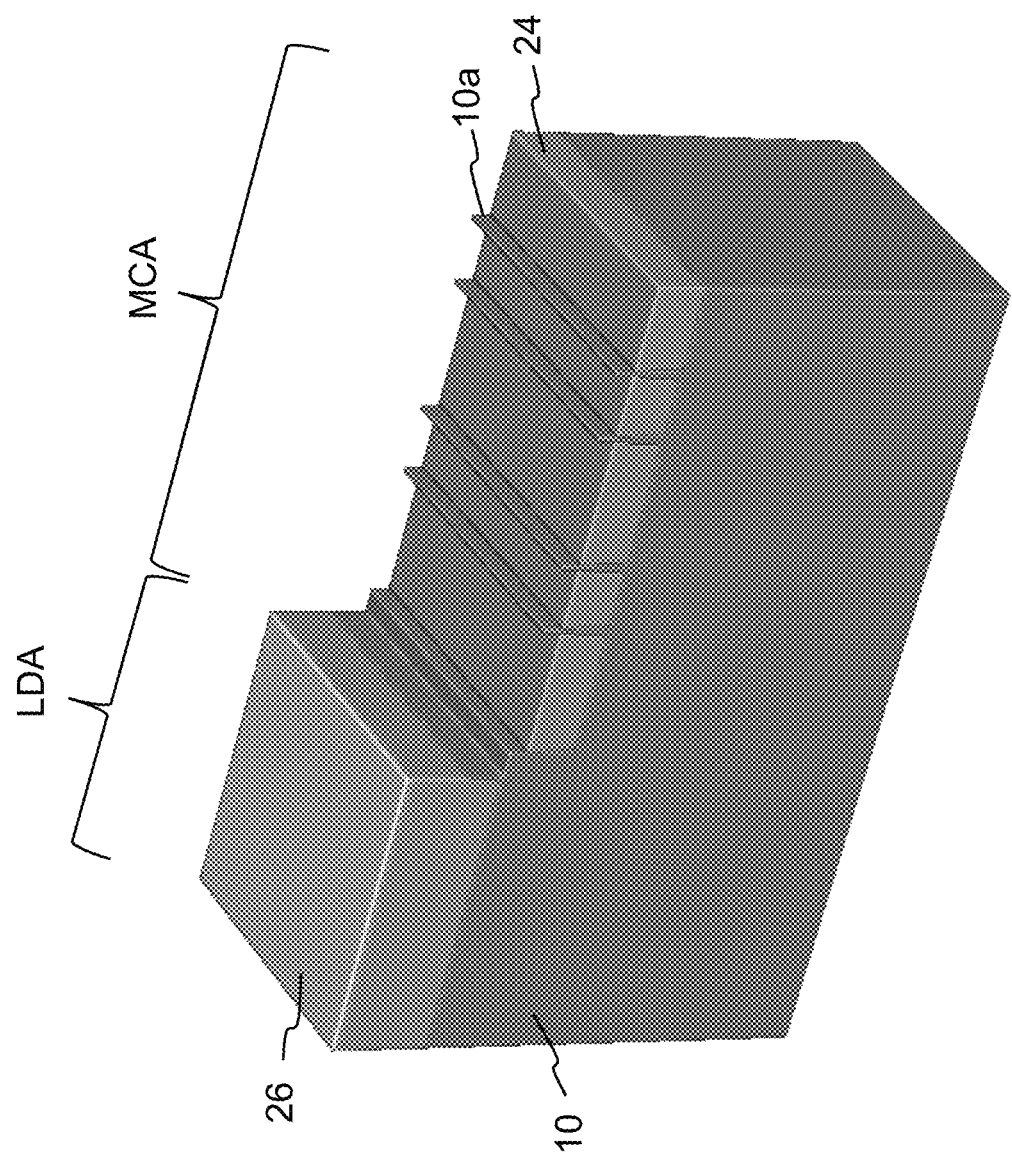
Figure 2E:
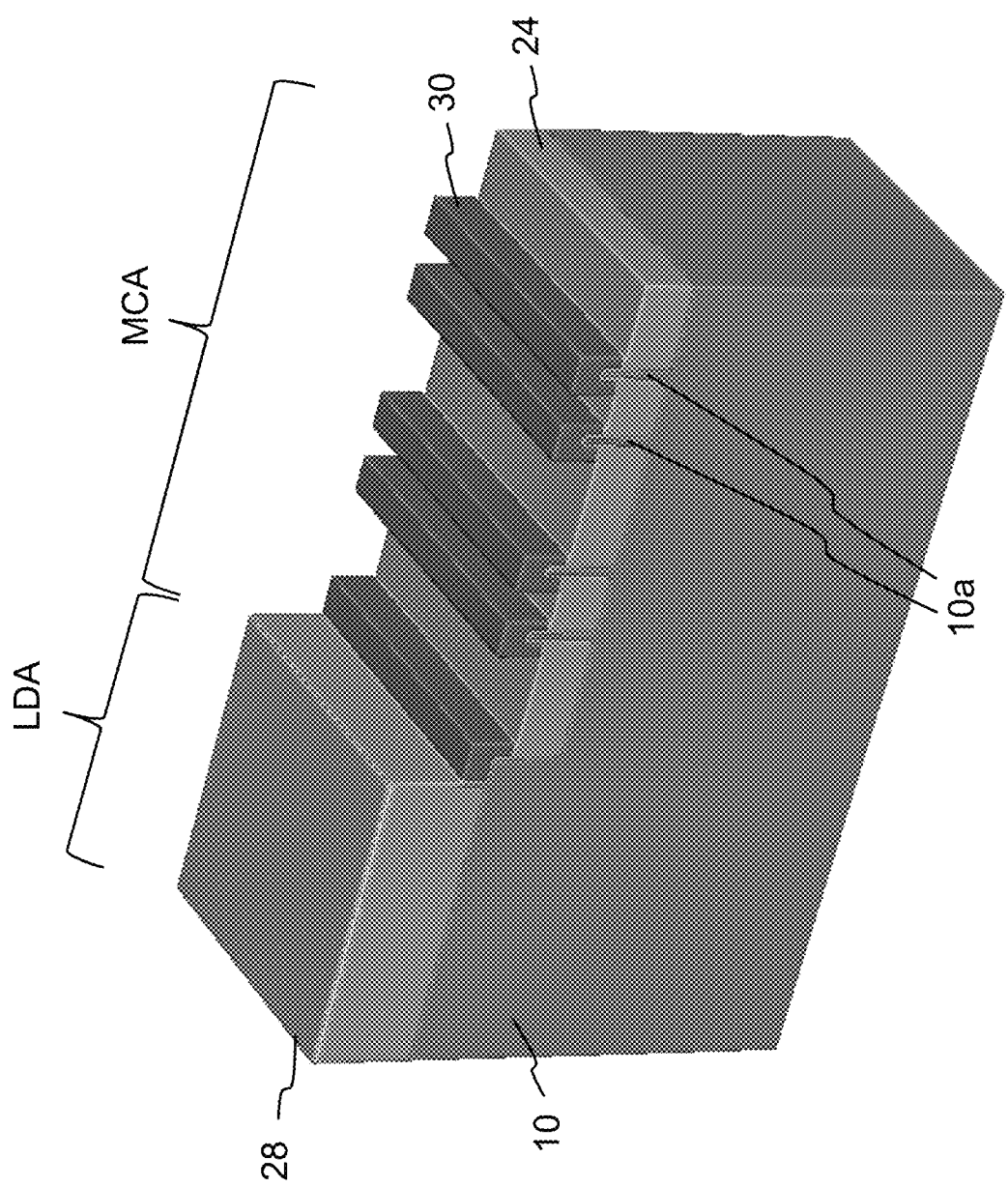
Figure 2F:
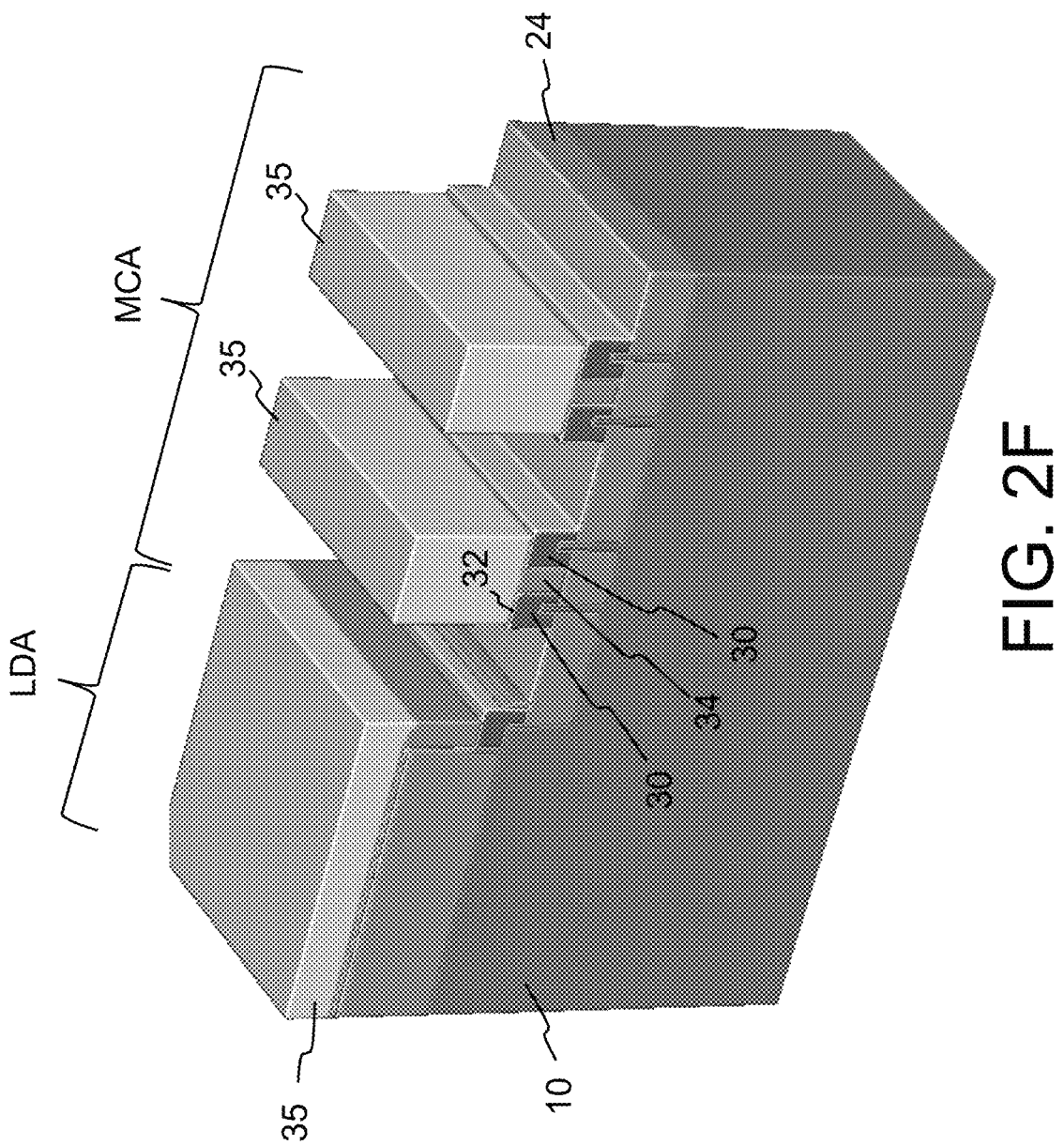
Figure 2G:
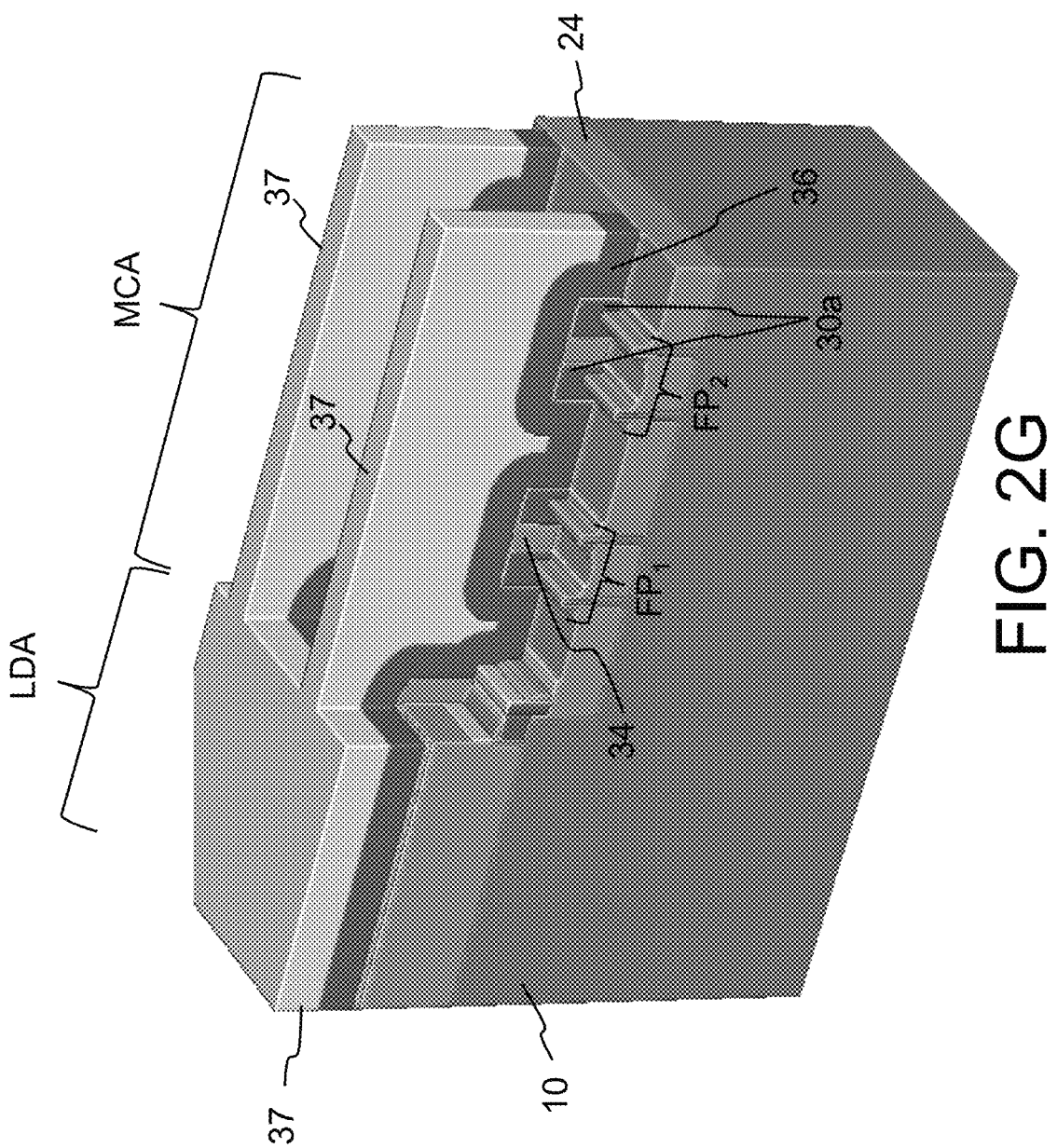
Figure 2H:
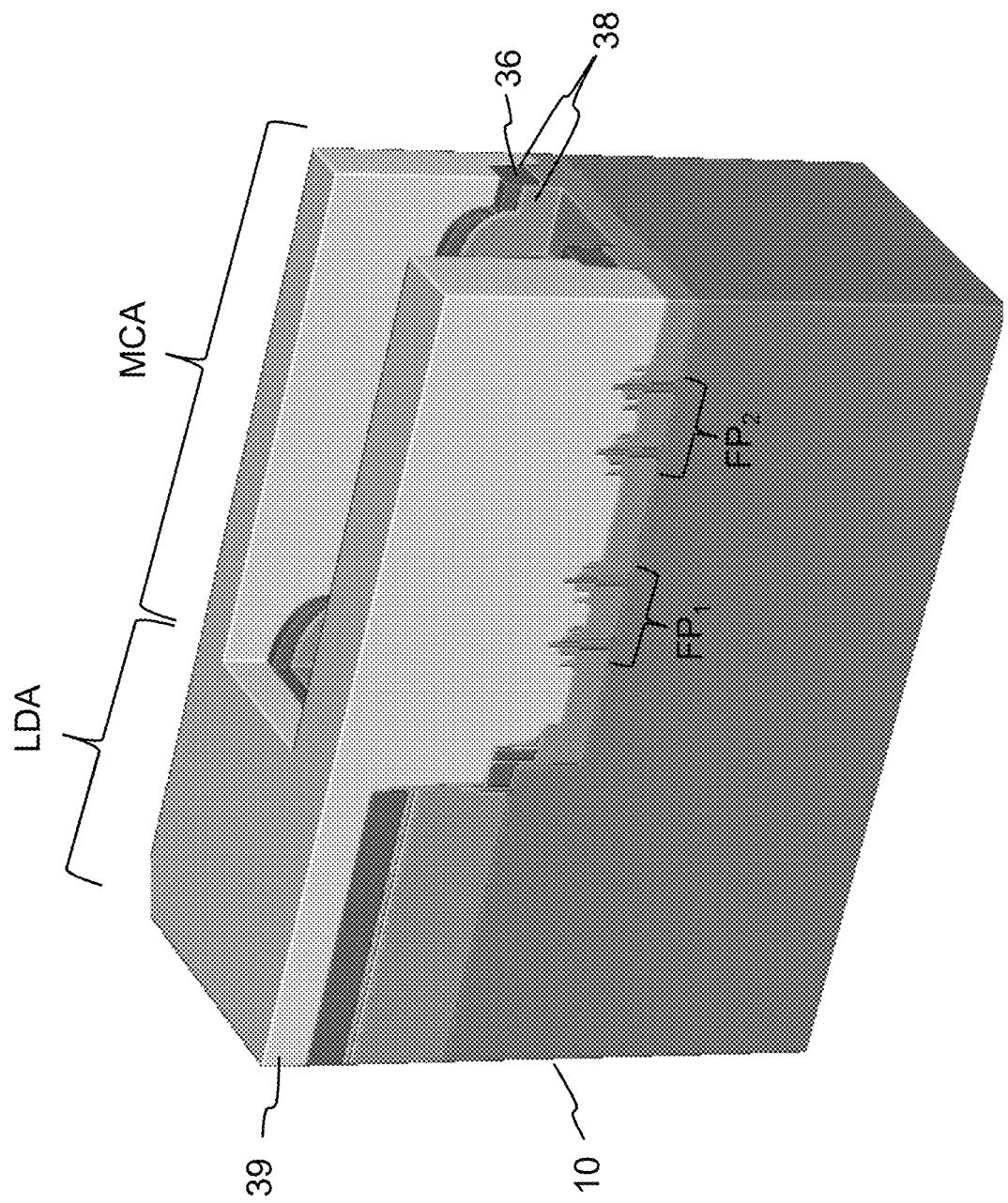
Figure 2J:
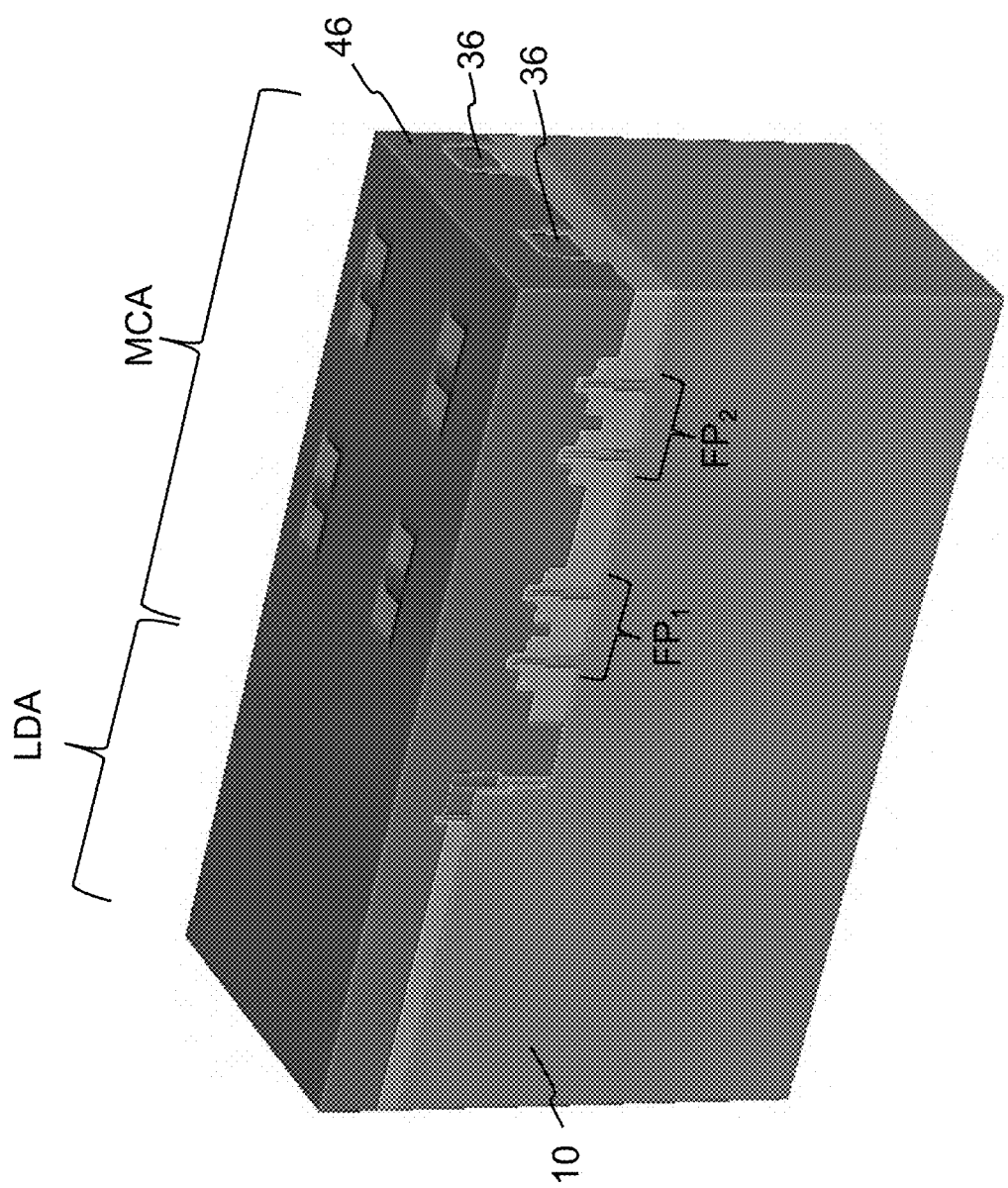
Figure 2K:
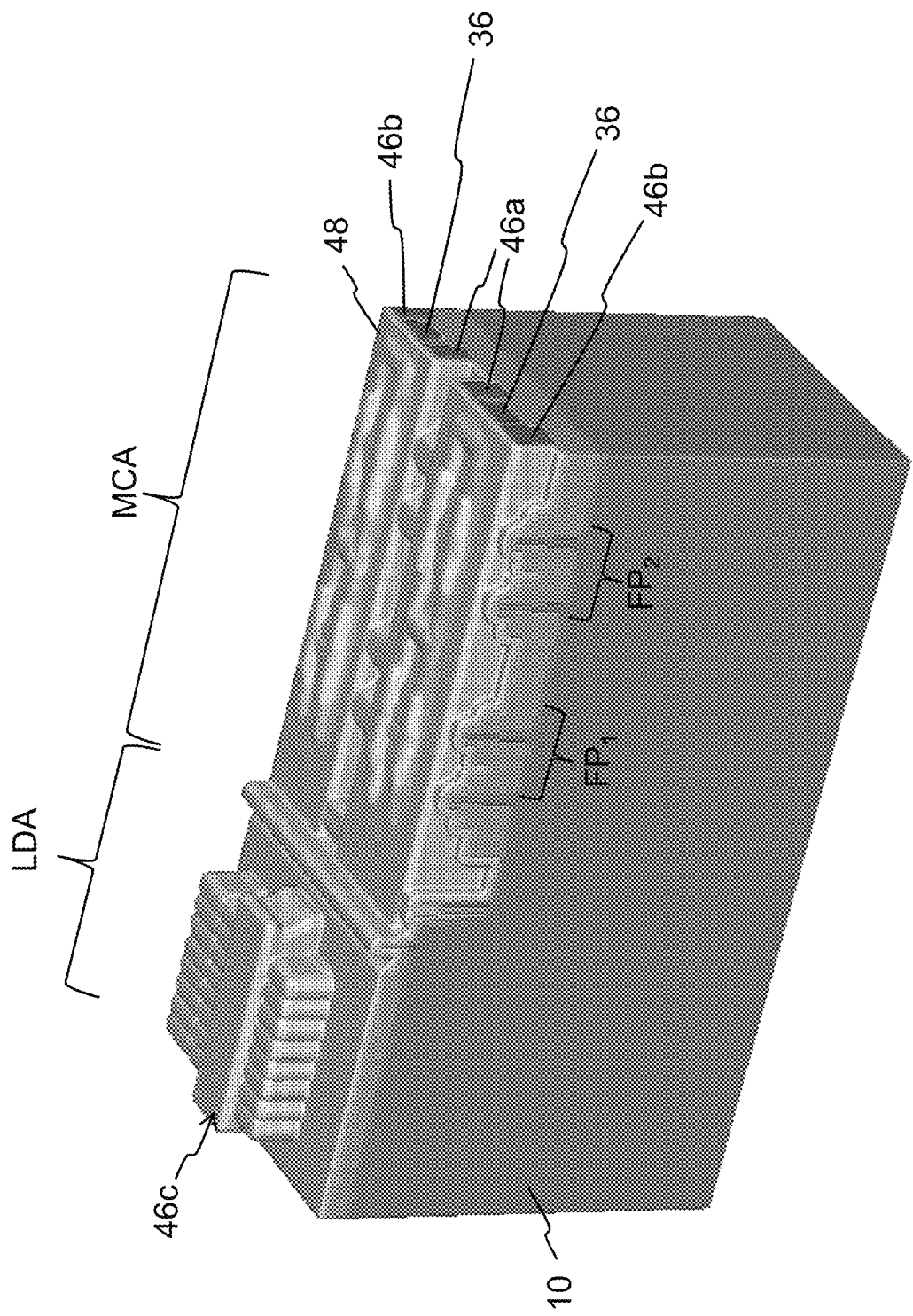
Figure 2L:
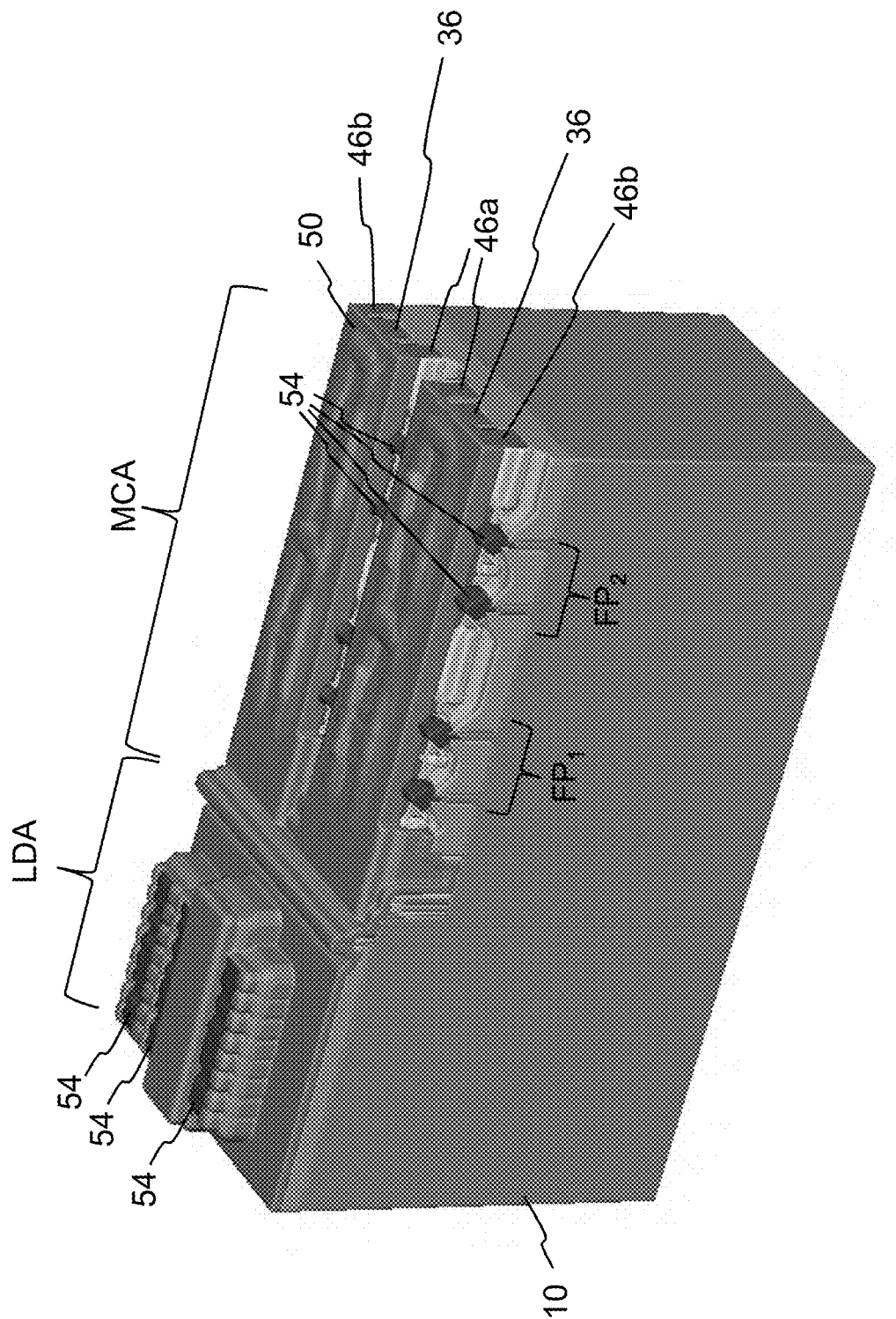
Figure 2M:
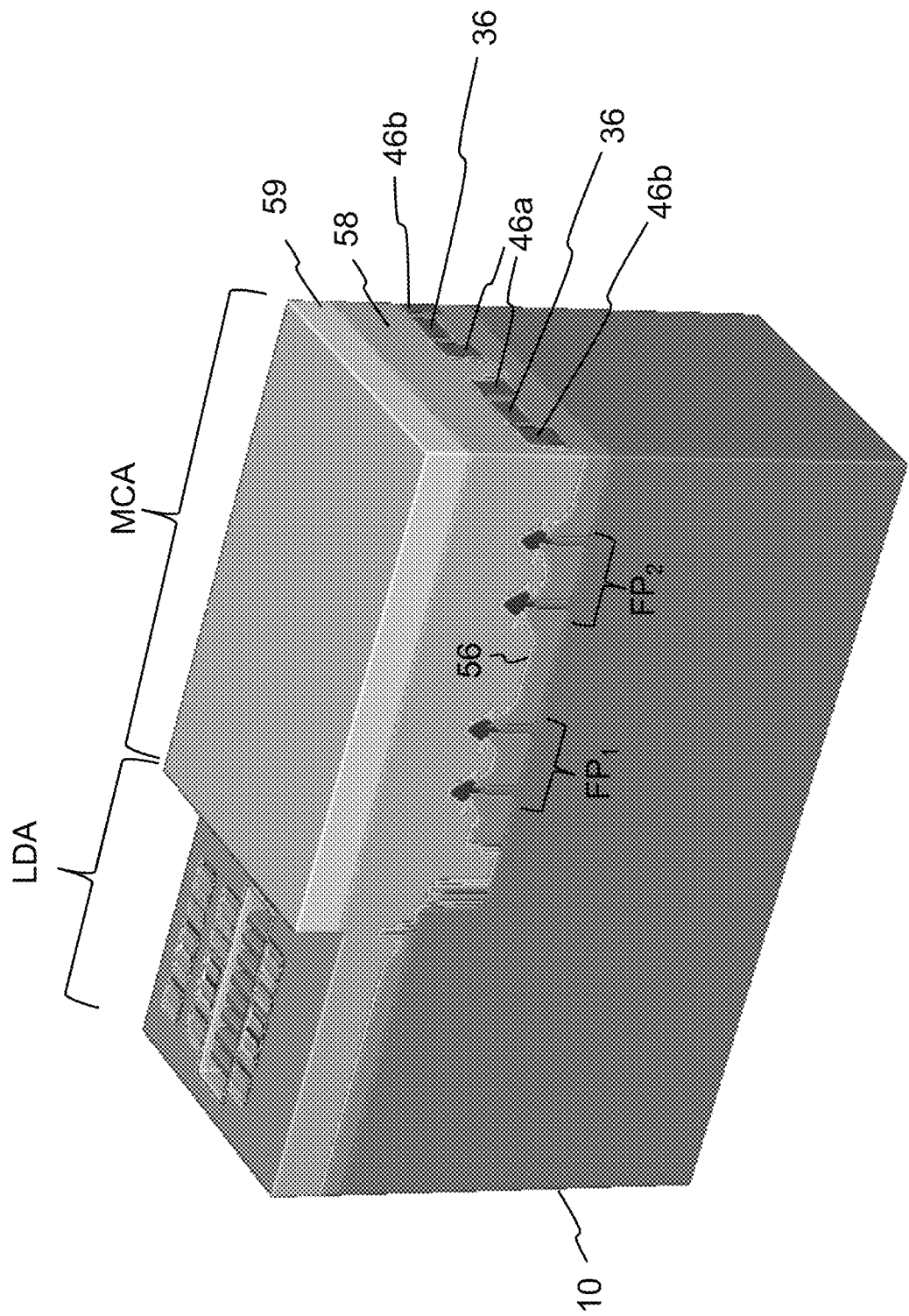
Figure 2N:
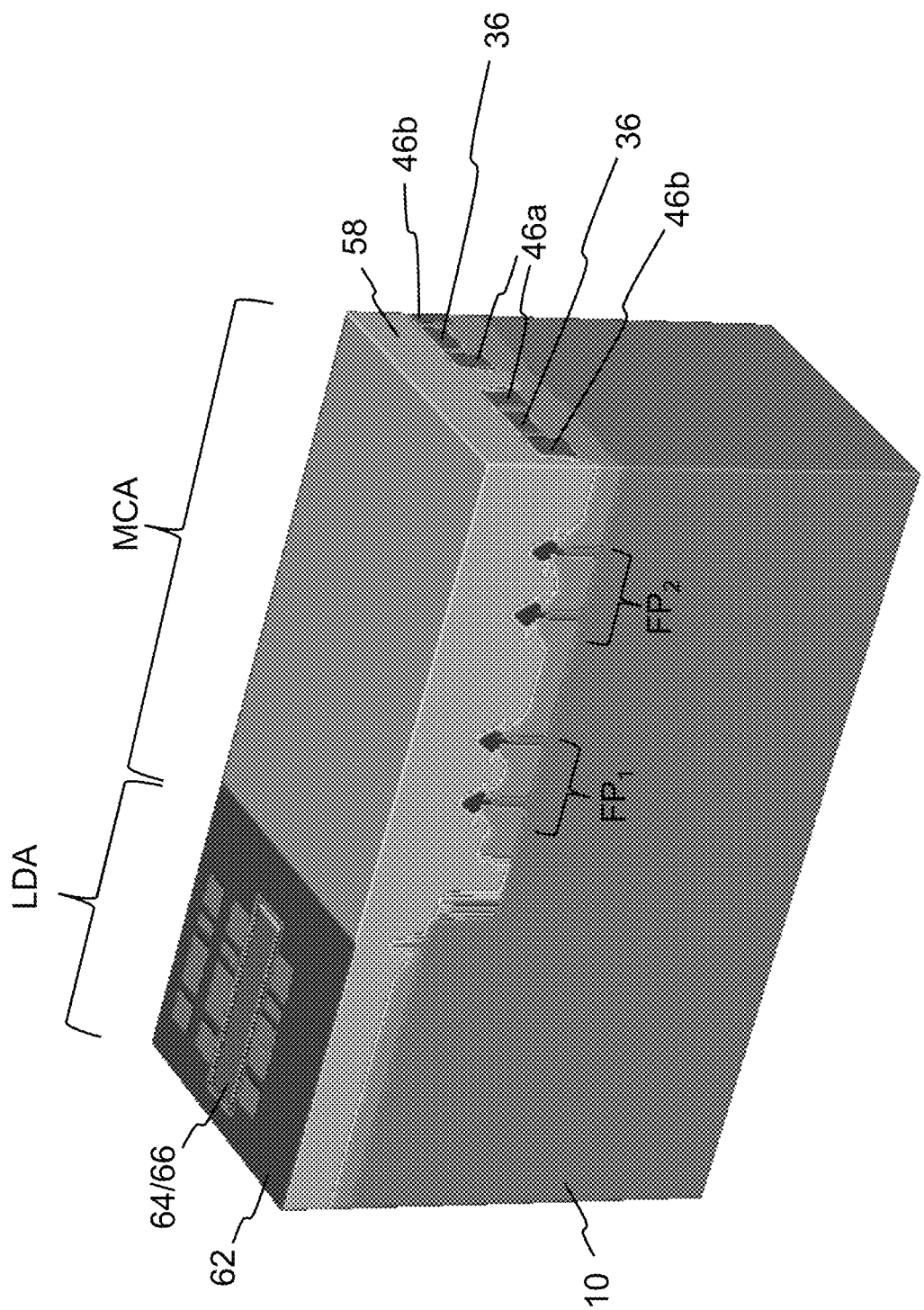
Figure 2O:
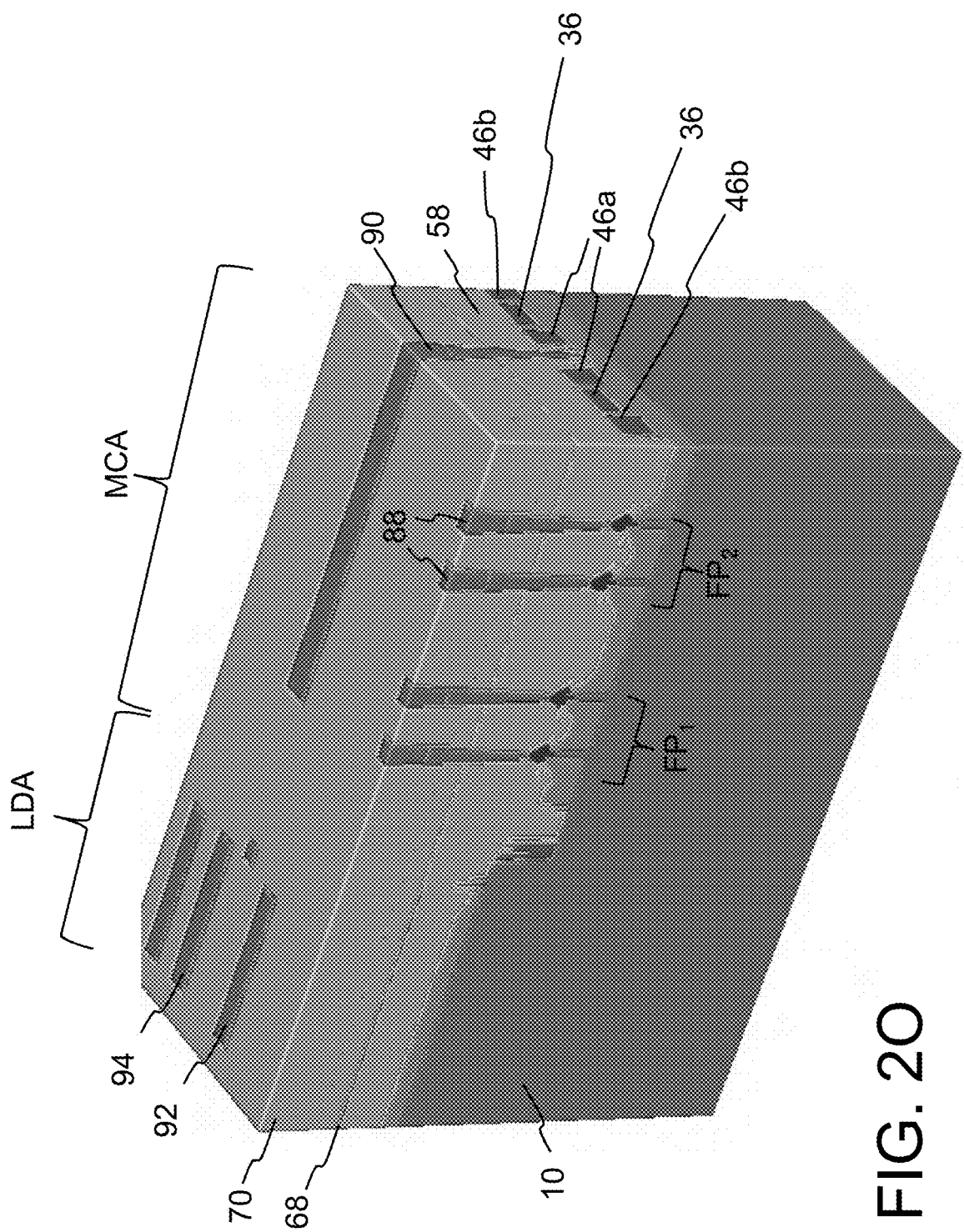

Referring to FIGS. 2A-2O, there are shown perspective cross-sectional views of steps in the process of making FinFET memory cells in a memory cell area (MCA) of a semiconductor substrate (also referred to as substrate) 10 of a memory device. The memory device can include just the memory cell array, or can include additional components such as supporting circuitry and logic devices. Logic devices, if included, are advantageously concurrently formed in a logic device area (LDA) of the substrate 10. The process begins by forming a layer of silicon dioxide 12 (also referred to as oxide) on the upper surface 11 of the semiconductor substrate 10, where semiconductor substrate 10 may be formed of P type single crystalline silicon. Oxide layer 12 can be formed by deposition or by thermal oxidation. A photolithography masking process is then used to pattern the oxide layer 12 (i.e. selectively remove some portions of the layer but not others). The photolithography masking process includes coating photoresist material 13 on the oxide layer 12, which is followed by exposing and developing the photoresist to remove the photoresist material from the memory cell area MCA while maintaining the photoresist in the logic device area LDA. An oxide etch is then used to remove the exposed portions of oxide layer 12 from the memory cell area MCA leaving the substrate 10 exposed (the photoresist 13 protects oxide layer 12 from the etch in the logic device area LDA). A silicon etch is used to recess the exposed upper surface 11 of the substrate 10 in the memory cell area MCA. Oxide layer 12 and the photoresist 13 protect the logic device area LDA from this silicon etch. The resulting structure is shown in FIG. 2A, where the upper surface 11 of the substrate 10 in the memory cell area MCA is recessed below the upper surface 11 of the substrate 10 in the logic device area LDA by a recess amount R.

After photoresist removal, an oxide layer 14 is formed on the structure. A silicon nitride ("nitride") layer 16 is formed on oxide layer 14. An insulation layer 18 (e.g., amorphous carbon) is formed on nitride layer 16. The insulation layer 18 is patterned by forming photoresist 19, selectively removing strips of the photoresist 19 in the memory cell area MCA and logic device area LDA, and removing the underlying exposed portions of the insulation layer 18 to form trenches 20 in the insulation layer 18 that extend down to and expose the underlying nitride layer 16, as shown in FIG. 2B.

After the photoresist 19 is removed, oxide spacers (not shown) are then formed in the trenches 20. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (often with a rounded upper surface). In the present case, oxide spacers are formed along the sidewalls of trenches 20. Portions of the oxide spacers in trenches 20 can be removed by covering the structure with photoresist followed by partial photoresist removal so that portions of the oxide spacers are exposed and can removed by oxide etch (e.g., portions of the spacers in the logic device area LDA). A nitride etch is then used to remove the exposed portions of nitride layer 16 (i.e., all but the portions of nitride layer 16 underneath the remaining oxide spacers), followed by an oxide etch to remove exposed portions of oxide layer 14 and the remaining oxide spacers. A silicon etch is then used to recess the exposed surface portions of the substrate 10, forming fins 10a of the substrate 10 in the memory cell area MCA and fins 10b (also referred to herein as logic fins 10b) of the silicon substrate in the logic device area LDA, as shown in FIG. 2C. In the memory cell area MCA, fins 10a are parallel to each other, and arranged in pairs (fin pairs $FP_n$). Two fin pairs $FP_1$ and $FP_2$ are shown in FIG. 2C, although one skilled in the art would understand there are many of such fin pairs $FP_n$ formed in the memory cell area MCA. For each fin pair $FP_n$, the two fins 10a thereof are separated from each other by a distance D1. Each fin pair $FP_n$ is separated from an adjacent fin pair $FP_n$ by a distance D2, where distance D2 is greater than distance D1.

The structure is covered in a thick layer of oxide (i.e., STI oxide) 24, which is then planarized (e.g., by chemical mechanical polish—CMP). A nitride layer 26 is formed over planarized oxide layer 24. Photoresist is formed over nitride layer 26, and removed from the memory cell area MCA. Etches are used to remove the exposed nitride layers 26/16 and oxide layer 14 in the memory cell area MCA, and recess thick oxide layer 24 to below the tops of fins 10a in the memory cell area MCA, as shown in FIG. 2D (after photoresist removal). A floating gate oxide layer 28 is formed on the structure. A floating gate polysilicon ("poly") layer is formed on the oxide layer 28 by a first polysilicon deposition. A chemical mechanical polish is used to planarize the poly layer, using the oxide layer 28 as a stop layer, which removes poly layer from the logic device area LDA. A poly etch back is used to recess poly layer in the memory cell area MCA. The poly layer is then patterned (photoresist formation, exposure, and partial removal, followed by poly etch), so that strips 30 of the poly layer remain, each extending along the top and sidewalls of one of the fins 10a in the memory cell area MCA, as shown in FIG. 2E (after photoresist removal).

An insulation layer 32 (e.g., ONO, which includes oxide, nitride, oxide sublayers) is formed over the structure. A buffer oxide layer 34 is formed on the structure, followed by an oxide etch back, which fills the spaces between the fins 10a with the buffer oxide layer 34. Photoresist 35 is formed over the structure, and partially removed, leaving strips of photoresist 35 covering the fin pairs $FP_n$, but leaving the areas between adjacent fin pairs $FP_n$ exposed. An oxide etch is then used to remove the exposed portion of buffer oxide layer 34 between the fin pairs $FP_n$ (i.e., remove the exposed portion of buffer oxide layer 34 between poly strips 30), as shown in FIG. 2F. For each fin pair $FP_n$, the buffer oxide layer 34 is maintained between the two poly strips 30 of the fin pair $FP_n$.

After photoresist 35 is removed, a poly layer is formed on the structure. Photoresist 37 is formed over the structure, and partially removed, leaving strips of photoresist 37 extending across the fin pairs $FP_n$ (i.e., strips of photoresist 37 extend lengthwise orthogonally to the length of fin pairs $FP_n$). Etches are performed to remove exposed portions of poly layer, insulation layer 32, and poly strips 30 between the strips of photoresist 37, as shown in FIG. 2G. Strips 36 of the poly layer remain, each extending down between fin pairs $FP_n$, but not extending down between the fins 10a of each fin pair $FP_n$ (i.e., oxide 34 prevents poly strips 36 from extending down between the fins 10a of each fin pair $FP_n$). Distinct poly blocks 30a (remaining portions of poly strips 30) remain, where each poly block 30a is disposed underneath one of the poly strips 36.

Oxide spacers 38 are then formed by oxide deposition and anisotropic etch, to cover the exposed sidewalls of poly strips 36 and poly blocks 30a. Photoresist 39 is formed over the structure, and partially removed to expose portions of the memory cell area MCA (i.e., the area between adjacent poly strips 36), as shown in FIG. 2H. An implantation process is performed to form source regions 40 (best seen in FIG. 3) in the fins 10a between the adjacent poly strips 36. An isotropic oxide etch is used to remove oxide spacers 38 on the exposed sidewalls of poly strips 36 and poly blocks 30a (i.e., those sidewalls facing each other for adjacent poly strips 36). After photoresist 39 is removed, a layer of oxide (tunnel oxide) 42 is formed on the exposed sidewalls of poly blocks 30a (e.g., by high temperature oxidation—HTO). At this stage, for each pair of poly strips 36, and the adjacent poly blocks 30a underneath on the same fin 10a, sidewalls facing each other are covered by tunnel oxide layer 42 and sidewalls facing away from each other are covered by oxide spacers 38. Photoresist is formed over the structure, and partially removed to expose portions of the memory cell area MCA (i.e., for adjacent poly blocks 30a on the same fin 10a, the area around sidewalls facing away from each other are exposed, leaving oxide spacers 38 exposed). An implantation process is performed to implant material into the portions of fins 10a adjacent oxide spacers 38 on sidewalls of poly blocks 30a. These implanted areas of fins 10a will eventually be disposed underneath the word line gates which are formed later. An oxide etch is then used to remove oxide from, and to leave exposed, top and side surface portions of the fins 10a that were just implanted. After photoresist removal, an oxide layer 44 (word line oxide) is formed on the exposed top and side surfaces of fins 10a. The resulting structure is shown in FIG. 2I (except source region 40, which is better shown in FIG. 3).

Photoresist is formed over the structure, and removed from the logic device area LDA. A series of etches are performed to remove the oxide and nitride layers down to the thick oxide layer 24, and to recess thick oxide layer 24, so that fins 10b protrude and are partially exposed in the logic device area LDA. An oxide layer (not shown) is then formed to cover the exposed top and side surfaces of fins 10b in the logic device area LDA. A poly layer 46 is then formed over the structure by a third poly deposition. The poly layer 46 is planarized by CMP (using oxide on poly strips 36 in the memory cell area MCA as a CMP stop layer), as shown in FIG. 2J.

Photoresist is formed on the structure and removed from the memory cell area MCA. An isotropic poly etch is used to recess the poly layer 46 in the memory cell area MCA. After photoresist removal, photoresist is formed over the structure, and selectively removed leaving strips of photoresist extending across the fins 10a/10b in both the memory cell area MCA and logic device area LDA. A poly etch is used to remove exposed portions of poly layer 46 (except for those portions under the strips of photoresist). After photoresist removal, an insulation layer 48 (preferably formed of a low K material—i.e., one with a dielectric constant below that of oxide—such as SiON) is formed over the structure. The resulting structure is shown in FIG. 2K. In the memory cell area MCA, strips 46a/46b of poly layer 46 remain, each extending across the fins 10a and laterally adjacent to poly blocks 30a (see FIG. 2G) and poly strips 36 (i.e., poly blocks 30a and poly strips 36 are between poly strips 46a and 46b). In the logic device area LDA, poly strips 46c of poly layer 46 remain (disposed under the portion of layer 48 indicated by the arrow in FIG. 2K), each extending across fins 10b (only one set of fins 10b and one strip 46c are shown for simplicity).

An etch is performed, leaving spacers of the insulation layer 48 on the vertical surfaces of the structure. An isotropic etch is used to expose fins 10b adjacent poly strip 46c in the logic device area LDA. A hard mask layer 50 (e.g., SiCN) is formed over the structure. Photoresist is formed on the structure and patterned to selectively expose portions of the hard mask layer 50 between adjacent poly strips 46a and between adjacent poly strips 46b in the memory cell area MCA, and portions of the hard mask layer 50 adjacent poly strip 46c in the logic device area LDA. Etches are used to remove the exposed portions of hard mask layer 50 and oxide layer 44 in the memory cell area MCA, exposing portions of fins 10a between adjacent poly strips 46a and between adjacent poly strips 46b. These etches also remove exposed portions of hard mask layer 50 and oxide (previously not shown) on fins 10*b* on both sides of poly strip 46*c* in the logic device area LDA. An implantation is then performed into the exposed portions of fins 10*a* in memory cell area MCA to form drain regions 52 therein (and to enhance source regions 40). This implantation also forms source and drain regions 40L and 52L in fins 10*b* on opposing sides of poly strip 46*c* in the logic region LDA. After photoresist removal, an epitaxial layer 54 is grown on the exposed source and drain regions 40/52 of fins 10*a* in the memory cell area MCA, and on the exposed source and drain regions 40L/52L of fins 10*b* in the logic device area LDA. Epitaxial layer 54 expands the size of source/drain regions (for easier contact formation and reliability) and increases carrier mobility in the fins 10*a*/10*b* for better conduction. The resulting structure is shown in FIG. 2L (except for source/drain regions 40/52 which are better shown in FIG. 3, and source/drain regions 40L/52L which are better shown in FIG. 7).

The remaining portions of hard mask layer 50 are then removed by etch. The structure is then covered by a layer of nitride 56. A thick layer of oxide 58 is formed over the structure, and planarized by CMP. Photoresist 59 is formed over the structure, and selectively removed from the logic device area LDA. An oxide etch is used to expose poly strips 46*c*. A poly etch is then used to remove poly strips 46*c* from logic device area LDA, as shown in FIG. 2M. An oxide etch is used to remove the oxide on the fins 10*b* which was previously under poly strips 46*c*, leaving portions of the fins 10*b* in logic device area LDA exposed. An oxide layer 60 is then formed which covers the exposed fins 10*b* in logic device area LDA. A layer of high K material 62 (i.e. having a dielectric constant K greater than that of oxide, such as HfO2, ZrO2, TiO2, Ta2O5, or other adequate materials) is formed on the structure (namely on oxide layer 60). One or more metal layers are then formed on the structure. For example, a TiN layer 64 is formed on the structure, followed by a thick layer of tungsten 66, followed by CMP using the high K layer 62 in the logic device area LDA as the stop layer (which removes the TiN layer 64 and tungsten 66 on the structure except for strips thereof where poly strips 46*c* were located). The resulting structure is shown in FIG. 2N (except for oxide layer 60 and high K material layer 62 which are better shown in FIGS. 7 and 8), where strips of TiN layer 64 and tungsten 66 in the logic device area LDA extend across fins 10*b* (effectively replacing dummy poly strip 46*c* which was previously removed).

A nitride layer 68 is formed over the structure, and an oxide layer 70 is formed on nitride layer 68. Photoresist is formed over the structure, and patterned so as to expose portions of oxide layer 70 over poly strips 46*b* in memory cell area MCA. Etches are performed to remove portions of oxide layer 70, nitride layer 68 and thick oxide layer 58 over, and expose the tops of, poly strips 46*b*. After photoresist removal, salicide 72 is formed on the top surface of poly strips 46*b* by Ti/Pt deposition and anneal. Any excessive Ti is removed by Ti etch, if required. Oxide is deposited to fill in the area over salicide 72. Photoresist is formed over the structure, and patterned to remove portions of the photoresist vertically over source/drain regions 40/52 in the memory cell area MCA, and vertically over the source/drain regions 40L/52L in the logic device area LDA. Contact holes are then formed where the photoresist was removed by a series of etches that extend down to and expose respective source or drain regions. Specifically, contact holes in the memory cell area MCA each extend down to and expose one of the drain regions 52, contact holes in the memory cell area MCA extend down to and expose the source regions 40, contact holes in the logic device area LDA extend down to and expose the source regions 40L, and contact holes in the logic device area LDA extend down to and expose the drain regions 52L. TiN is deposited on the structure, and a layer of tungsten is deposited on the TiN layer. A CMP is used to remove the TiN and tungsten layers, except for in the contact holes. The TiN and tungsten in the contact holes form contacts, namely, drain contacts 88 that extend down to, and make electrical contact with, drain regions 52, source contacts 90 that extend down to, and make electrical contact with, source regions 40, source contacts 92 that extend down to, and make electrical contact with, source regions 40L, and drain contacts 94 that extend down to, and make electrical contact with, drain regions 52L. The final structure is shown in FIG. 2O. Further contact processing may be performed to further extend and route the respective source and drain contacts 88/90/92/94, as well as form other contacts for poly strips 46*a*/46*b* as needed.

Figure 3:
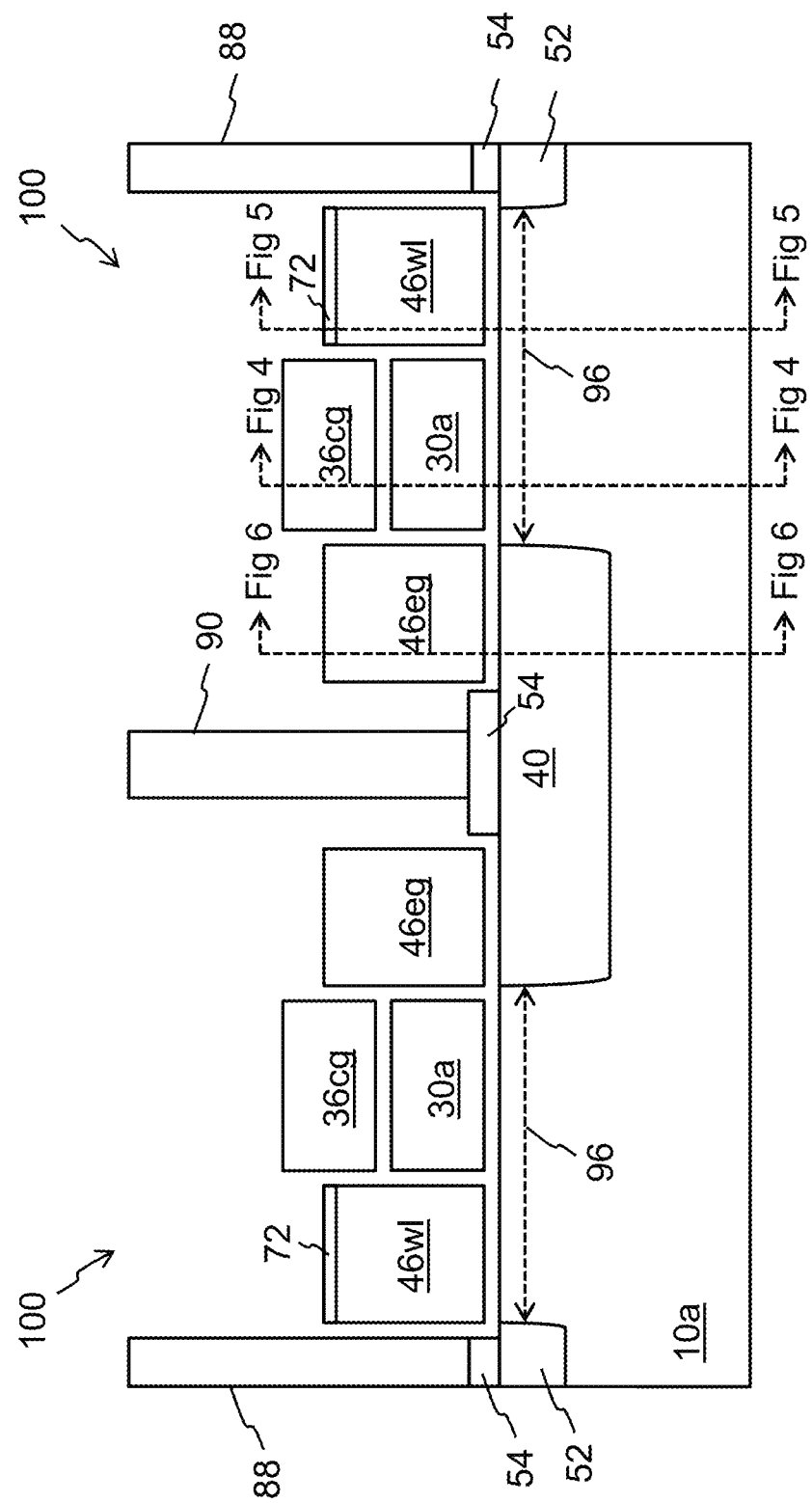
FIG. 3 is a side cross sectional view of a pair of memory cells.

FIG. 3 shows a pair of the memory cells 100 formed on one of the fins 10*a* in the memory cell area MCA, although it should be appreciated that additional pairs of memory cells are formed end to end on each fin 10*a*. Each of the fins 10*a* (as well as fins 10*b* in the logic device area LDA) includes a pair of opposing side surfaces 10*c* and 10*d* that extend upwardly and terminate in a top surface 10*e* (see FIG. 4). Each memory cell 100 includes a source region 40 and a drain region 52, which define a channel region 96 of the semiconductor substrate there between. The channel region 96 extends along the side surfaces 10*c*/10*d* and top surface 10*e* of the fin 10*a* between the source and drain regions 40/52. Poly block 30*a* is a floating gate which wraps around and is insulated from the side surfaces 10*c*/10*d* and top surface 10*e* (i.e., the floating gate 30*a* extends along and is insulated from the side surfaces 10*c*/10*d* and top surface 10*e* of fin 10*a*), for controlling the conductivity of a first portion of the channel region 96, as best shown in FIG. 4. A word line gate 46*w*1 is that portion of poly strip 46*b* that wraps around and is insulated from the side surfaces 10*c*/10*d* and top surface 10*e* of the fin 10*a* (i.e., the word line gate 46*w*1 extends along and is insulated from the side surfaces 10*c*/10*d* and top surface 10*e* of fin 10*a*), for controlling the conductivity of a second portion of the channel region 96, as best shown in FIG. 5. Silicide 72 on word line gate 46*w*1 increases conductivity. An erase gate 46*eg* is that portion of poly strip 46*a* which wraps around and is insulated from the source region 40 of the fin 10*a* (i.e., the erase gate 46*eg* extends along and is insulated from the side surfaces 10*c*/10*d* and top surface 10*e* of fin 10*a*), as best shown in FIG. 6. A control gate 36*cg* is that portion of poly strip 36 (i.e., a first continuous strip of conductive material) that is disposed over and insulated from the floating gate 30*a*. Drain contacts 88 and source contact 90 (extending down and making contact with respective epitaxial layer portions 54) are further shown in FIG. 3.

FIG. 7 shows a logic device 102, formed on one of the logic fins 10*b* in logic device area LDA, which includes a logic source region 40L and a logic drain region 52L that define a logic channel region 98 of the semiconductor substrate there between. The logic channel region 98 extends along the side surfaces 10*c*/10*d* and top surface 10*e* of the fin 10*b* (best shown in FIG. 8) between the logic source and logic drain regions 40L/52L. A logic gate 104 is (collectively) those portions of TiN layer 64 and tungsten layer 66 that wrap around the side surfaces 10*c*/10*d* and top surface 10*e* of the logic fin 10*b* (and insulated therefrom by oxide layer 60 and high K material layer 62) for controlling the conductivity of the logic channel region 98, as best shown in FIG. 8. Preferably, multiple logic devices 102 are operated in parallel. Specifically, as shown in FIGS. 7-8, eight logic devices 102 on eight adjacent fins 10b are connected in parallel (i.e., the logic gates 104 for the eight logic devices are formed as a continuous strip of conductive material (i.e., a second continuous strip of conductive material), namely, the TiN layer 64 layer and the tungsten layer 66, a single source contact 92 (extending down and making contact with respective epitaxial layer portions 54) connects to the eight logic source regions 40L of the eight logic devices 102, and a single drain contact 94 (extending down and making contact with respective epitaxial layer portions 54) connects to the eight logic drain regions 52L of the eight logic devices 102). The eight logic devices are operated simultaneously in parallel, to provide eight times the operating current that would be supplied by a single logic device 102 formed on only a single logic fin 10b. However, the number of logic devices 102 operated together in parallel can be any number (two or greater), and/or individual logic devices 102 can be operated separately and individually, depending upon the operating current needed from the logic device(s). Additionally, the total number of logic devices 102 on one of the logic fins 10b, the total number of logic fins 10b, and the total number of logic devices 102 in the logic device area LDA, can vary. Reference to "logic" fin, "logic" source region, "logic" drain region, "logic" channel region, without limitation, merely means these elements are in the logic device area LDA and are different from like elements in the memory cell area MCA.

Figure 9:
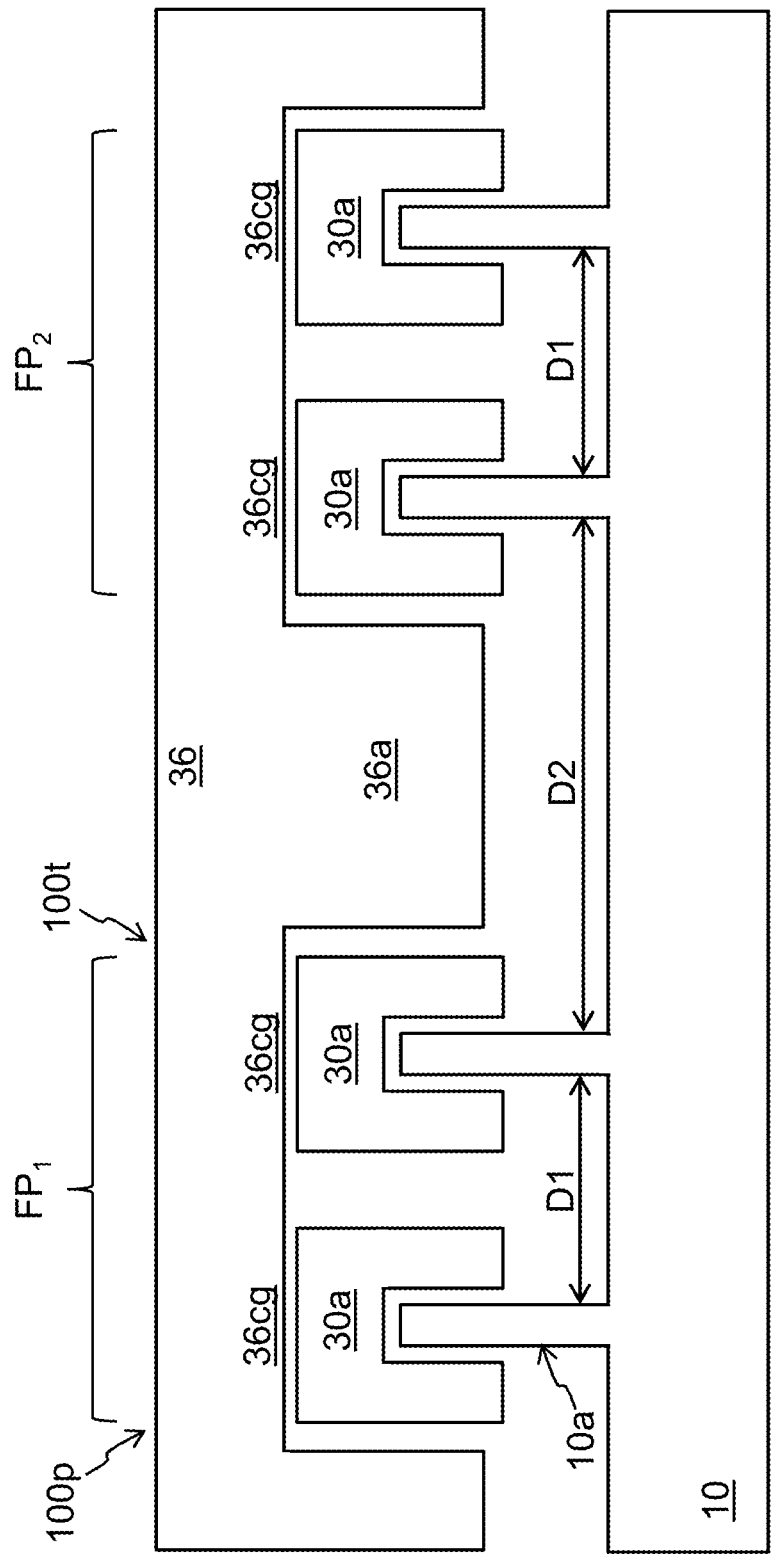
FIG. 9 is a side cross sectional view of floating gates and control gates, and fin-to-fin spacing for two adjacent fin pairs $FP_n$.

FIG. 9 shows the fin spacing and control gate configuration for the memory cells in the memory cell area MCA. Fins 10a are parallel to each other (i.e., each have a length that is parallel to a first direction such as the column direction). For each fin pair $FP_n$, the two fins 10a are adjacent to each other (i.e., no intervening fins therebetween), and are spaced from each other by a distance D1. However, the spacing of the fins from one fin pair $FP_n$ to an adjacent fin pair $FP_n$ is a distance D2, which is greater than distance D1. Specifically, FIG. 9 illustrates first and second fins 10a (from left to right) of Fin pair $FP_1$ separated by a distance D1 (i.e., a first distance), and third and fourth fins 10a (from left to right) of fin pair $FP_2$ separated by a distance D1 (i.e., a second distance), where the first and second distances are equal to each other. The second and third fins are separated by a distance D2 (i.e., a third distance) which is greater than the first and second distances D1. Additionally, the poly strip 36 has a portion 36a that extends down and is disposed between the floating gates 30a of two adjacent fin pairs $FP_n$, but no such portion extends down or is disposed between fins 10a of the same fin pair $FP_n$. This means that the two floating gates 30a for any one fin pair $FP_n$ are spaced closer together and don't have any control gate portion 36a therebetween, while any two floating gates 30a of two adjacent fin pairs $FP_n$ are spaced further apart and do have the poly strip portion 36a therebetween. This configuration results in enhancing capacitive coupling between the two floating gates 30a of the same fin pair $FP_n$ because of closer proximity and no portion of the poly strip 36 is disposed therebetween, while minimizing capacitive coupling between floating gates 30a of different but adjacent fin pairs $FP_n$ because of lesser proximity and portion 36a of poly strip 36 is disposed therebetween.

Capacitive coupling between floating gates with the same fin pair $FP_n$ can be used for fine tuning programming. For example, in programming the left hand floating gate 30a of fin pair $FP_1$ in FIG. 9 (i.e., in the programmed memory cell 100p), the control gate 36cg can be used to implement the majority of the programming operation. Thereafter, capacitive coupling from the right hand floating gate 30a of fin pair $FP_1$ (i.e., in the tuning memory cell 100t) can then be used to fine tune the programming of the left hand floating gate 30a of fin pair FP1 (programmed memory cell 100p), while not disturbing the programing state or operation of the floating gates 30a in fin pair FP2. There are many possible applications for this type of program fine tuning. Specifically, tuning accuracy is critical when using memory cells to store weights for artificial neural networks. Precision better than single elementary charge is difficult or not possible for weight tuning using traditional memory programming/erase methods. Scaling of memory cell geometry in advanced technology nodes greatly reduces the tuning accuracy due to increased effect of each elementary charge.

Using floating gate to floating gate capacitive coupling as a fine tuning program mechanism can improve weight program accuracy. Capacitive coupling is not limited to a single elementary charge of the weighted charge storage element (namely the floating gate). Capacitive coupling from an adjacent memory cell (i.e., the tuning memory cell 100t) to the memory cell being programmed (i.e., the programmed memory cell 100p) need not result in a discrete potential change on the programmed memory cell. Using capacitive coupling from an adjacent floating gate to fine tune the programming of the programmed memory cell provides for a much finer resolution in memory cell program tuning. An elementary charge transferred or removed from the adjacent tuning memory cell will change the programming value of the programmed memory cell proportional to the capacitive coupling between the two memory cells. The change to the programmed memory cell will be much less than that of an elementary charge. Therefore, the resolution, and thus the final accuracy, of program tuning may be adjusted to a desired level with process adjustments to the floating gate voltage coupling and/or the rate of charge transfer to the adjacent tuning memory cell.

Figure 10A:
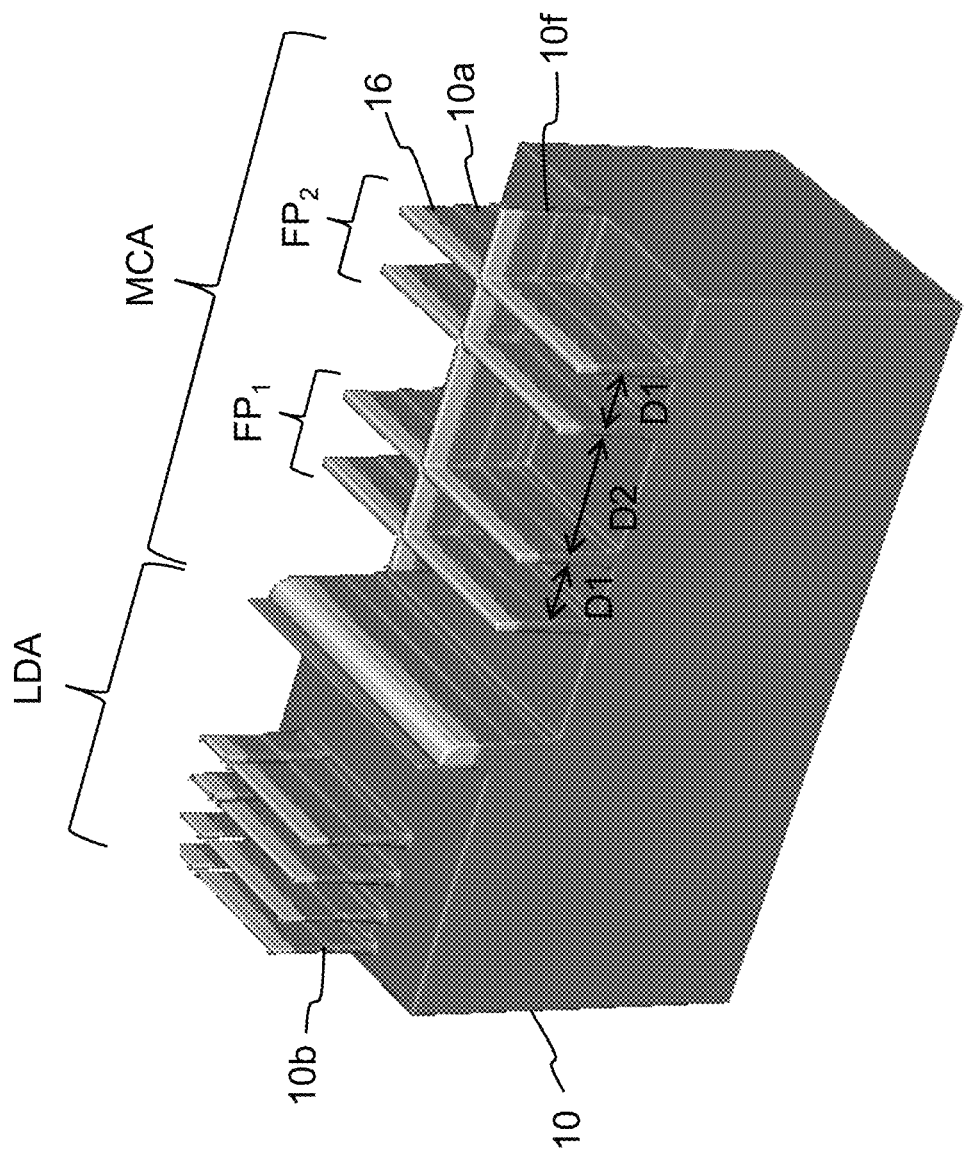
FIGS. 10A-10C are perspective views showing the steps in forming the memory cells according to an alternate embodiment of the present invention.
Figure 10B:
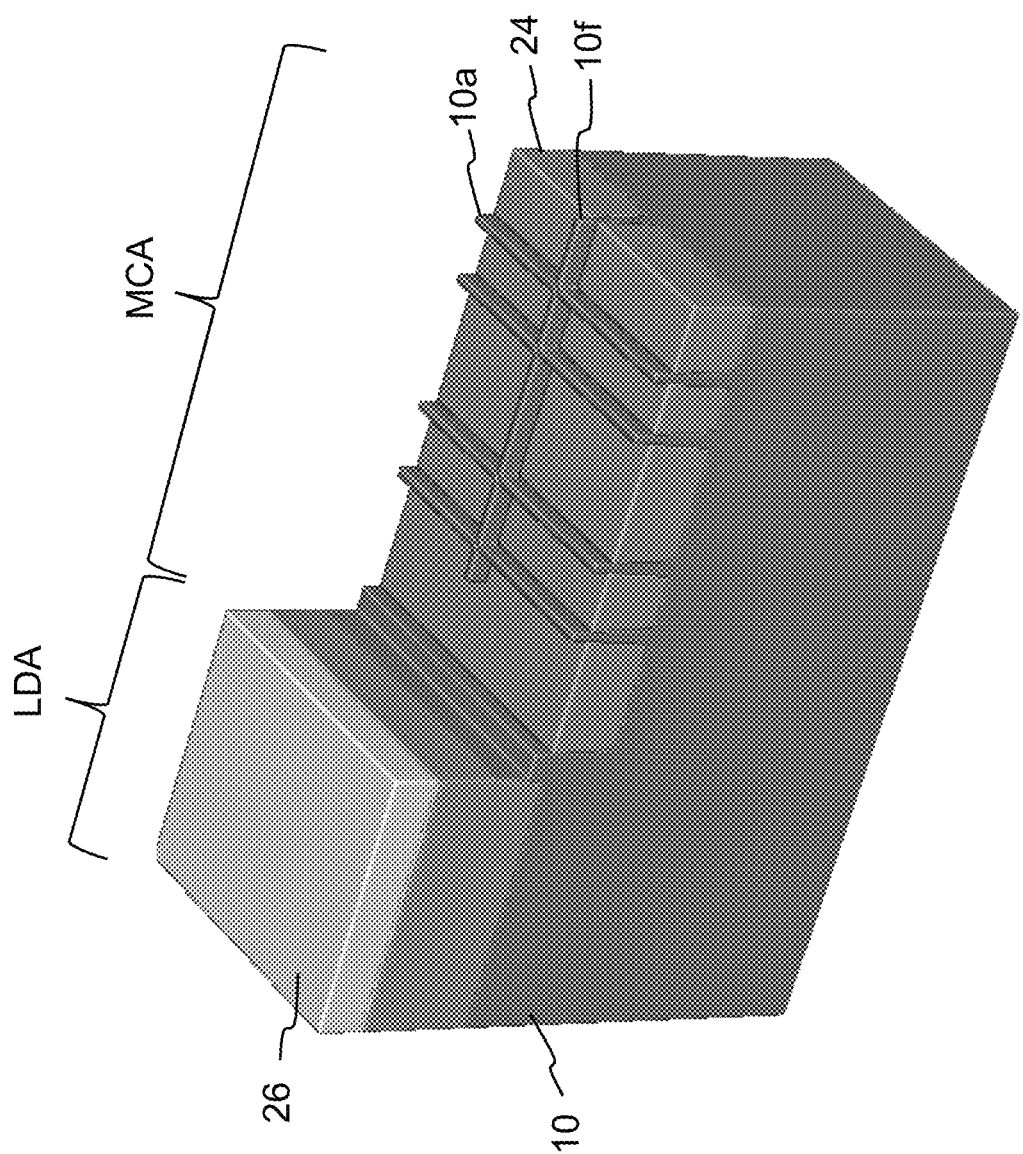
Figure 10C:
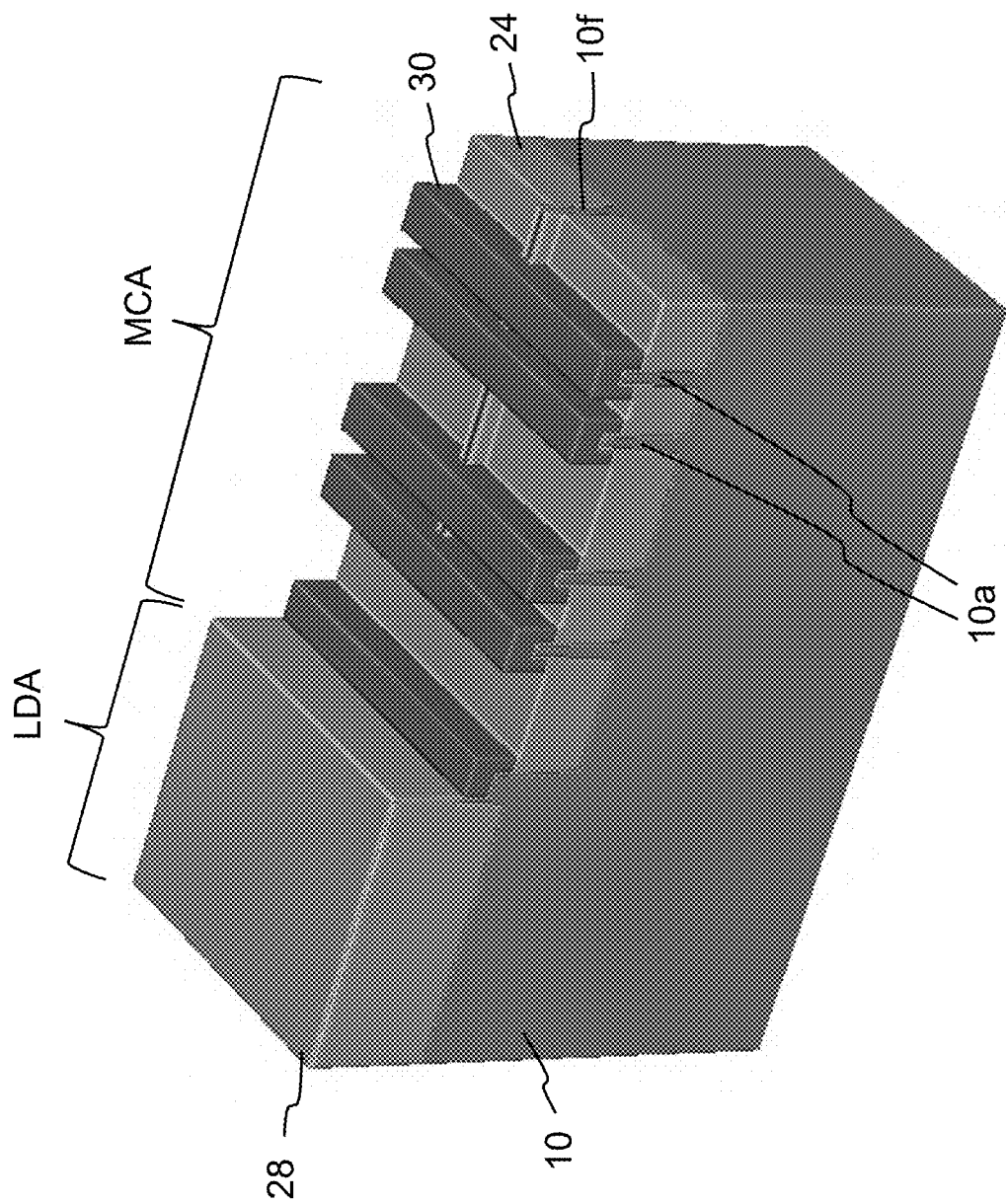
Figure 11:
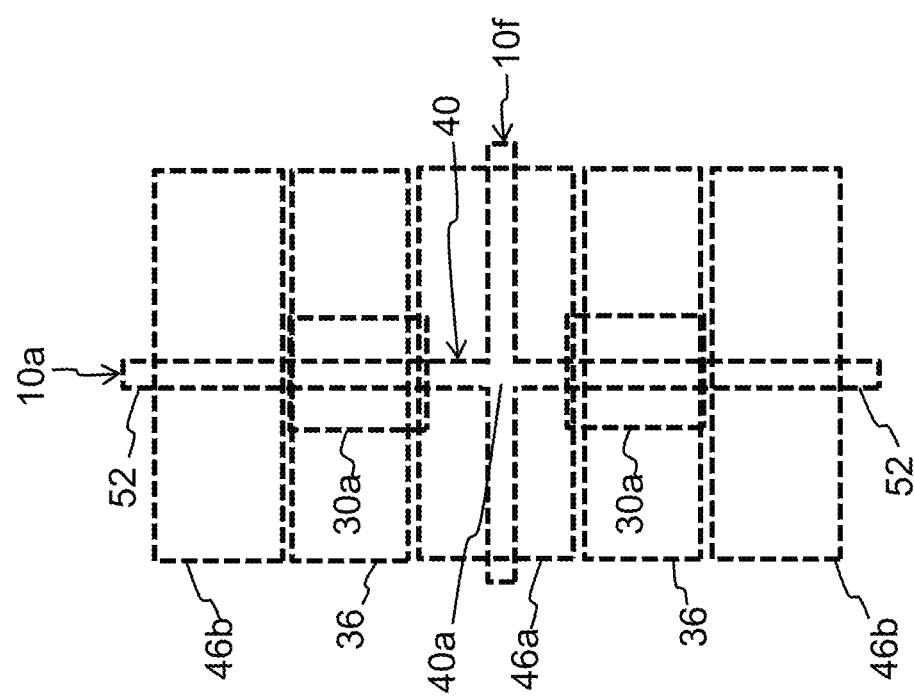
FIG. 11 is a plan view of the layout of the memory cells according to the alternative embodiment of the present invention.

FIGS. 10A-10C and 11 illustrate an alternate embodiment, where the memory cell source regions are formed as a continuous source line along a fin extending in the row direction. The process begins with the same structure as shown in FIG. 2B, except that an additional trench is formed that is orthogonal to, and extends across, trenches 20. Then, after performing the steps described above with respect to FIG. 2C, an additional source fin 10f is formed that extends orthogonal to fins 10a in the memory cell area MCA, as illustrated in FIG. 10A. After performing the steps described above with respect to FIG. 2D, the resulting structure is shown in FIG. 10B, where source fin 10f crosses fins 10 in an orthogonal manner. After performing the steps described above with respect to FIG. 2E, the resulting structure is shown in FIG. 10C, where subsequently formed elements such as poly strips 30 are formed in a similar manner but traversing over source fin 10f. The remaining steps described above with respect to FIGS. 2F-2O are performed to complete the formation of the memory cells 100 and logic devices 102. The final layout of the memory cells 100 in this alternate embodiment is shown in FIG. 11, and is the same as layout of the memory cells 100 in the embodiment of FIGS. 2A-2O, except a continuous source line 40a extends along source fin 10f, where the source region 40 for each memory cell is formed in fin 10a at an intersection of fin 10a and source fin 10f.

The alternate embodiment is advantageous because the continuous source line 40a extends across the isolation regions between adjacent cells (in the row direction), allowing for scaling the cells down to a smaller size because this configuration avoids the need to form source line contacts for each pair of memory cells. Instead, the continuous source line 40*a* extending along the source fin 10*f* can be electrically connected to a strap through periodic strap contacts (e.g., every 32 or 64 columns). By having a contact every 32 or 64 columns instead of one for every column, the size of the memory cells and thus a memory array of the memory cells can be significantly reduced.

It is to be understood that the present invention is not limited to the embodiment(s) described above and illustrated herein. For example, references to the present invention herein are not intended to limit the scope of any claim or claim term, but instead merely make reference to one or more features that may be covered by one or more claims. Materials, processes and numerical examples described above are exemplary only, and should not be deemed to limit the claims. Further, as is apparent from the claims and specification, not all method steps need be performed in the exact order illustrated or claimed, but rather in any order (unless there is an explicitly recited limitation on any order) that allows the proper formation of the memory cells and logic devices of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A memory device, comprising:
    a semiconductor substrate having an upper surface with a plurality of fins that extend upwardly, wherein each of the fins includes opposing side surfaces that terminate in a top surface;
    each of the plurality of fins includes a memory cell formed thereon that includes:
        spaced apart source and drain regions in the fin, with a channel region of the fin extending along the opposing side surfaces and top surface of the fin between the source and drain regions,
        a floating gate that extends along a first portion of the channel region, wherein the floating gate wraps around the fin such that the floating gate extends along and is insulated from the opposing side surfaces and the top surface of the fin,
        a word line gate that extends along a second portion of the channel region, wherein the word line gate wraps around the fin such that the word line gate extends along and is insulated from the opposing side surfaces and the top surface of the fin,
        a control gate that is disposed over and insulated from the floating gate, and
        an erase gate that is disposed over and insulated from the source region;
    wherein:
        the control gates are a first continuous strip of conductive material;
        first, second, third and fourth fins of the plurality of fins each have lengths that are parallel to a first direction;
        the first and second fins are adjacent to each other, and spaced apart by a first distance;
        the third and fourth fins are adjacent to each other, and spaced apart by a second distance;
        the second and third fins are adjacent to each other, and spaced apart by a third distance; and
        the first continuous strip of conductive material includes a portion that is disposed between the second and third fins, but no portion of the first continuous strip of conductive material is disposed between the first and second fins, and no portion of the first continuous strip of conductive material is disposed between the third and fourth fins.

2. The memory device of claim 1, wherein the portion of the first continuous strip of conductive material disposed between the second and third fins is disposed between the floating gate wrapped around the second fin and the floating gate wrapped around the third fin.

3. The memory device of claim 2, wherein no portion of the first continuous strip of conductive material is disposed between the floating gate wrapped around the first fin and the floating gate wrapped around the second fin, and wherein no portion of the first continuous strip of conductive material is disposed between the floating gate wrapped around the third fin and the floating gate wrapped around the fourth fin.

4. The memory device of claim 1, wherein the third distance is greater than the first and second distances.

5. The memory device of claim 4, wherein the first and second distances are equal to each other.

6. The memory device of claim 1, wherein each of the erase gates wraps around one of the fins such that the erase gate extends along and is insulated from the opposing side surfaces and the top surface of the one fin.

7. The memory device of claim 1, further comprising:
    a plurality of logic fins of the semiconductor substrate upper surface that extend upwardly, wherein each of the logic fins includes opposing side surfaces that terminate in a top surface; and
    each of the plurality of logic fins includes a logic device formed thereon that includes:
        spaced apart logic source and logic drain regions in the logic fin, with a logic channel region of the logic fin extending along the opposing side surfaces and top surface of the logic fin between the logic source and logic drain regions, and
        a logic gate that extends along the logic channel region, wherein the logic gate wraps around the logic fin such that the logic gate extends along and is insulated from the opposing side surfaces and the top surface of the logic fin.

8. The memory device of claim 7, wherein the logic gates are a second continuous strip of conductive material.

9. The memory device of claim 1, further comprising:
    a source fin of the semiconductor substrate upper surface that extends upwardly, wherein:

the source fin includes opposing side surfaces that terminate in a top surface, the source fin has a length that is parallel to a second direction orthogonal to the first direction, the source fin intersects the first, second, third and fourth fins, and each of the source regions is formed at an intersection of the source fin and one of the first, second, third and fourth fins.

10. A method of forming a memory device, comprising:

forming a plurality of fins that extend upwardly from an upper surface of a semiconductor substrate, wherein each of the fins includes opposing side surfaces that terminate in a top surface; and forming a memory cell on each one of the plurality of fins, wherein the forming of each of the memory cells on one of the fins includes:

forming spaced apart source and drain regions in the fin, with a channel region of the fin extending along the opposing side surfaces and top surface of the fin between the source and drain regions, forming a floating gate that extends along a first portion of the channel region, wherein the floating gate wraps around the fin such that the floating gate extends along and is insulated from the opposing side surfaces and the top surface of the fin, forming a word line gate that extends along a second portion of the channel region, wherein the word line gate wraps around the fin such that the word line gate extends along and is insulated from the opposing side surfaces and the top surface of the fin, forming a control gate that is disposed over and insulated from the floating gate, and forming an erase gate that is disposed over and insulated from the source region;

wherein:

the control gates are a first continuous strip of conductive material;

first, second, third and fourth fins of the plurality of fins each have lengths that are parallel to a first direction;

the first and second fins are adjacent to each other, and spaced apart by a first distance;

the third and fourth fins are adjacent to each other, and spaced apart by a second distance;

the second and third fins are adjacent to each other, and spaced apart by a third distance; and the first continuous strip of conductive material includes a portion that is disposed between the second and third fins, but no portion of the first continuous strip of conductive material is disposed between the first and second fins, and no portion of the first continuous strip of conductive material is disposed between the third and fourth fins.

11. The method of claim 10, wherein the portion of the first continuous strip of conductive material disposed between the second and third fins is disposed between the floating gate wrapped around the second fin and the floating gate wrapped around the third fin.

12. The method of claim 11, wherein no portion of the first continuous strip of conductive material is disposed between the floating gate wrapped around the first fin and the floating gate wrapped around the second fin, and wherein no portion of the first continuous strip of conductive material is disposed between the floating gate wrapped around the third fin and the floating gate wrapped around the fourth fin.

13. The method of claim 10, wherein the third distance is greater than the first and second distances.

14. The method of claim 13, wherein the first and second distances are equal to each other.

15. The method of claim 10, wherein each of the erase gates wraps around one of the fins such that the erase gate extends along and is insulated from the opposing side surfaces and the top surface of the one fin.

16. The method of claim 10, further comprising:

forming a plurality of logic fins of the semiconductor substrate upper surface that extend upwardly, wherein each of the logic fins includes opposing side surfaces that terminate in a top surface; and forming a logic device on each one of the plurality of logic fins, wherein the forming of each of the logic devices on one of the logic fins includes:

forming spaced apart logic source and logic drain regions in the logic fin, with a logic channel region of the logic fin extending along the opposing side surfaces and top surface of the logic fin between the logic source and logic drain regions, and forming a logic gate that extends along the logic channel region, wherein the logic gate wraps around the logic fin such that the logic gate extends along and is insulated from the opposing side surfaces and the top surface of the logic fin.

17. The method of claim 16, wherein the logic gates are a second continuous strip of conductive material.

18. The method of claim 10, further comprising:

forming a source fin of the semiconductor substrate upper surface that extends upwardly, wherein:

the source fin includes opposing side surfaces that terminate in a top surface, the source fin has a length that is parallel to a second direction orthogonal to the first direction, the source fin intersects the first, second, third and fourth fins, and each of the source regions is formed at an intersection of the source fin and one of the first, second, third and fourth fins.

* * * * *